(12) United States Patent
Kim et al.

(10) Patent No.: US 12,132,110 B2
(45) Date of Patent: Oct. 29, 2024

(54) SYNAPTIC TRANSISTOR WITH LONG-TERM AND SHORT-TERM MEMORY

(71) Applicant: KOOKMIN UNIVERSITY INDUSTRY ACADEMY COOPERATION FOUNDATION, Seoul (KR)

(72) Inventors: Dae Hwan Kim, Seoul (KR); Dong Yeon Kang, Seongnam-si (KR); Jun Tae Jang, Bucheon-si (KR); Shin Young Park, Seoul (KR); Hyun Kyu Lee, Suwon-si (KR); Sung Jin Choi, Seoul (KR); Dong Myoung Kim, Seoul (KR); Wonjung Kim, Seoul (KR)

(73) Assignee: KOOKMIN UNIVERSITY INDUSTRY ACADEMY COOPERATION FOUNDATION, Seoul (KR)

( * ) Notice: Subject to any disclaimer, the term of this patent is extended or adjusted under 35 U.S.C. 154(b) by 567 days.

(21) Appl. No.: 17/462,554

(22) Filed: Aug. 31, 2021

(65) Prior Publication Data
US 2022/0077314 A1    Mar. 10, 2022

(30) Foreign Application Priority Data

Sep. 8, 2020 (KR) .......... 10-2020-0114325
Sep. 8, 2020 (KR) .......... 10-2020-0114326
Sep. 8, 2020 (KR) .......... 10-2020-0114327

(51) Int. Cl.
*H01L 29/786* (2006.01)
*G06N 3/063* (2023.01)
(Continued)

(52) U.S. Cl.
CPC ......... *H01L 29/7841* (2013.01); *G06N 3/063* (2013.01); *H01L 21/02178* (2013.01);
(Continued)

(58) Field of Classification Search
CPC ............ H01L 29/7841; H01L 29/7869; H01L 29/7883; G06N 3/063
(Continued)

(56) References Cited

U.S. PATENT DOCUMENTS

2021/0098611 A1*  4/2021  Hersam .................. G06N 3/065

FOREIGN PATENT DOCUMENTS

| KR | 20080103517 | 11/2008 |
|----|-------------|---------|
| KR | 20140032186 | 3/2014  |

(Continued)

OTHER PUBLICATIONS

Kang et al, "Characteristics of a-IGZO Synaptic Transistor having Extended Gate with Al₂O₃ gate insulator by low temperature ALD" Intelligent Semiconductor for Technology Convergence, The 27th Korean Conference on Semiconductors, Dec. 2, 2020, School of Electrical Engineering, Kookmin University, Seoul, KR.
(Continued)

*Primary Examiner* — Hoai V Pham
(74) *Attorney, Agent, or Firm* — NORTON ROSE FULBRIGHT US LLP

(57) ABSTRACT

Disclosed is a synaptic transistor, including a substrate, an expansion gate electrode disposed to extend in one direction on the substrate, a gate insulating layer including ions, covering the expansion gate electrode, and disposed on the substrate, a channel layer disposed on the gate insulating layer to correspond to one end of the expansion gate electrode, source and drain electrodes spaced apart from each other, covering both ends of the channel layer, and disposed on the gate insulating layer, and a pad electrode disposed on the gate insulating layer to correspond to the other end of the expansion gate electrode.

6 Claims, 22 Drawing Sheets

(51) Int. Cl.
*H01L 21/02* (2006.01)
*H01L 29/66* (2006.01)
*H01L 29/78* (2006.01)
*H01L 29/788* (2006.01)

(52) U.S. Cl.
CPC .. *H01L 21/02565* (2013.01); *H01L 29/66969* (2013.01); *H01L 29/7869* (2013.01); *H01L 29/7883* (2013.01)

(58) Field of Classification Search
USPC .................................................. 257/250, 315
See application file for complete search history.

(56) References Cited

FOREIGN PATENT DOCUMENTS

| KR | 20170080433 | 7/2017 |
| KR | 20190016312 | 2/2019 |
| KR | 102074942 | 2/2020 |
| KR | 20200103139 | 9/2020 |

OTHER PUBLICATIONS

Cheng et al., "Proton Conductor Gated Synaptic Transistor Based on Transparent IGZO for Realizing Electrical and UV Light Stimulus" *Journal of the Election Devices Society* 2019, 7, 38-45.

Notice of Allowance issued in Corresponding Korean Application No. 10-2020-0114327, dated Oct. 20, 2021 (No English translation provided).

Office Action issued in Corresponding Korean Application No. 10-2020-0114325, dated Sep. 30, 2021 (No English translation provided).

Office Action issued in Corresponding Korean Application No. 10-2020-0114326, dated Oct. 20, 2021 (No English translation provided).

* cited by examiner (a)

(b)

(a)

(b)

SYNAPTIC TRANSISTOR WITH LONG-TERM AND SHORT-TERM MEMORY

CROSS-REFERENCE TO RELATED APPLICATION

This application claims priority to and the benefit of Korean Patent Application No. 10-2020-0114325, filed on Sep. 8, 2020, Korean Patent Application No. 10-2020-0114326, filed on Sep. 8, 2020, and Korean Patent Application No. 10-2020-0114327, filed on Sep. 8, 2020, the disclosures of each of which are incorporated herein by reference in their entireties.

BACKGROUND

1. Field of the Invention

The present invention relates to a synaptic transistor.

2. Discussion of Related Art

Recently, many attempts have been made to implement a neuromorphic system that mimics the synapses of neural systems using memristors.

The memristor is a two-terminal device composed of an electrode, a resistance change layer and an electrode, and the device operation is performed by a process in which the resistance of the resistance changing layer changes by an applied voltage. Such memristors are similar in structure to neurons and synapses in the nervous system.

That is, the nervous system transmits a signal in such a way that when a signal is applied to a synapse through a neuron, the ion distribution at the synapse changes while the neurotransmitter is transmitted to the next neuron, and in this process, the concentration and distribution of ions and neuroacceptors inside the synapse change while the signal transmission capability, so-called synaptic strength, changes. This simultaneously plays the role of a synapse communicating a signal and thereby changing the synaptic transmission capability. That is, the signal processing and the memory process occur simultaneously, resulting in learning capability. This process is similar to a process in which the resistance value of a resistance change layer in a memristor device changes with an applied voltage or current history, and thus, studies have been actively attempted to implement a device simulating synapses using the memristor.

Meanwhile, memristors highly utilize spike-timing-dependent-plasticity (STDP) during the learning process. Herein, STDP is a method of controlling a degree to which synapse strength changes according to the time difference of a voltage applied between a pre-neuron and a post-neuron. Since a signal for learning has to be applied to both neurons in different directions in the learning process using STDP, the signal should be stopped from being applied in the opposite direction while the signal is applied in one direction. Thus, memristors have difficulty performing the "signal processing" and the "learning" process simultaneously.

For this reason, attempts have been made to simulate the behavior of synapses using transistors that are three-terminal or four-terminal devices rather than two-terminal devices such as memristors.

Compared to the existing two-terminal devices, when a transistor device with three terminals or more is used, it is possible to simultaneously perform learning to adjust synaptic strength by applying a gate voltage while performing the signal processing by a voltage between the pre-neuron and post-neuron of the transistor.

As such, since the learning process can be performed simultaneously by the gate voltage during signal processing by a voltage between the source-drains, the synaptic behavior can be implemented more flexibly and in various ways.

SUMMARY OF THE INVENTION

It is an object of the present invention to provide a synaptic transistor that can induce a relatively large hysteresis to have a relatively high signal-to-noise ratio by causing immunity to a change in a threshold voltage that occurs in the manufacturing process of synaptic transistors.

In addition, it is an object of the present invention to provide a synaptic transistor capable of improving the synaptic characteristics by increasing a gating effect and increasing the increase width of a drain current.

In addition, it is an object of the present invention to provide a synaptic transistor capable of providing both short-term memory characteristics and long-term memory characteristics.

In addition, it is an object of the present invention to provide a synaptic transistor capable of simultaneously lowering a threshold voltage and improving the retention characteristics for long-term memory.

In order to achieve the above-described objects, the present invention provides a synaptic transistor, including a substrate, an expansion gate electrode disposed to extend in one direction on the substrate, a gate insulating layer including ions, covering the expansion gate electrode, and disposed on the substrate, a channel layer disposed on the gate insulating layer to correspond to one end of the expansion gate electrode, source and drain electrodes spaced apart from each other, covering both ends of the channel layer, and disposed on the gate insulating layer, and a pad electrode disposed on the gate insulating layer to correspond to the other end of the expansion gate electrode.

Herein, the ions may be hydrogen ions, and when a positive bias is applied to the pad electrode, the ions may move from the side of the pad electrode to the side of the channel layer, or when a negative bias is applied to the pad electrode, the ions may move from the side of the channel layer to the side of the pad electrode.

In addition, the present invention provides a synaptic transistor with long-term and short-term memory characteristics, including a substrate, a bottom gate electrode disposed on the substrate, a first gate insulating layer including ions, covering the bottom gate electrode, and disposed on the substrate, a floating gate electrode disposed on the first gate insulating layer to correspond to the bottom gate electrode, a second gate insulating layer comprising ions, covering the floating gate electrode, and disposed on the first gate insulating layer, a channel layer disposed on the second gate insulating layer to correspond to the floating gate electrode, and source and drain electrodes spaced apart from each other, covering both ends of the channel layer, and disposed on the second gate insulating layer.

When the synaptic transistor of the present invention performs the operation of the short-term memory characteristic, the ions may move from the side of the bottom gate electrode to the side of the channel layer, when a positive bias less than a reference voltage is applied to the bottom gate electrode.

In addition, when the synaptic transistor of the present invention performs the operation of the short-term memory characteristic, the ions may move from the side of the channel layer to the side of the bottom gate electrode, when a negative bias less than a reference voltage is applied to the bottom gate electrode.

In addition, when the synaptic transistor of the present invention performs the operation of the long-term memory characteristic, electrons included in the bottom gate electrode may move over the first gate insulating layer to the bottom gate electrode, when a positive bias greater than or equal to a reference voltage is applied to the bottom gate electrode.

In addition, when the synaptic transistor of the present invention performs the operation of the long-term memory characteristic, electrons included in the bottom gate electrode may move over the first gate insulating layer to the floating gate electrode, when a negative bias greater than or equal to a reference voltage is applied to the bottom gate electrode.

In addition, the present invention provides a synaptic transistor, including a substrate, a gate electrode disposed on the substrate, a gate insulating layer including hydrogen ions, covering the gate electrode, and disposed on the substrate, a retention layer made of an insulating material having a greater hydrogen bonding force than the gate insulating layer and disposed on the gate insulating layer, a channel layer disposed on the retention layer to correspond to the gate electrode, and source and drain electrodes spaced apart from each other, covering both ends of the channel layer, and disposed on the retention layer.

Herein, the gate insulating layer may be made of $Al_2O_3$ laminated by atomic layer deposition.

In addition, the hydrogen ions may move from the side of the gate electrode to the side of the channel layer, when a positive bias is applied to the gate electrode.

In addition, the hydrogen ions may move from the side of the channel layer to the side of the gate electrode, when a negative bias is applied to the gate electrode.

In addition, the hydrogen ions move at a slower rate in the retention layer than in the gate insulating layer.

According to the present invention, there is an effect of inducing a relatively large hysteresis to have a relatively high signal-to-noise ratio by causing immunity to a change in a threshold voltage that occurs in the manufacturing process of synaptic transistors.

In addition, according to the present invention, it is possible to improve the synaptic characteristics by increasing a gating effect and increasing the increase width of a drain current.

In addition, according to the present invention, it is possible to improve energy efficiency, which is an important indicator of neuromorphic computing, by the improved synaptic characteristics.

In addition, according to the present invention, it is possible to provide a synaptic transistor capable of providing both short-term memory characteristics and long-term memory characteristics. That is, it is possible to provide short-term memory characteristics by the movement of hydrogen ions present inside the gate insulating layer, and to provide long-term memory characteristics by charge trap inside the bottom gate or the floating gate.

In addition, according to the present invention, by further disposing a retention layer between a gate insulating layer and a channel layer, it is possible to reduce the threshold voltage and improve the retention characteristics for long-term memory at the same time.

DETAILED DESCRIPTION OF EXEMPLARY EMBODIMENTS

Figure 1:
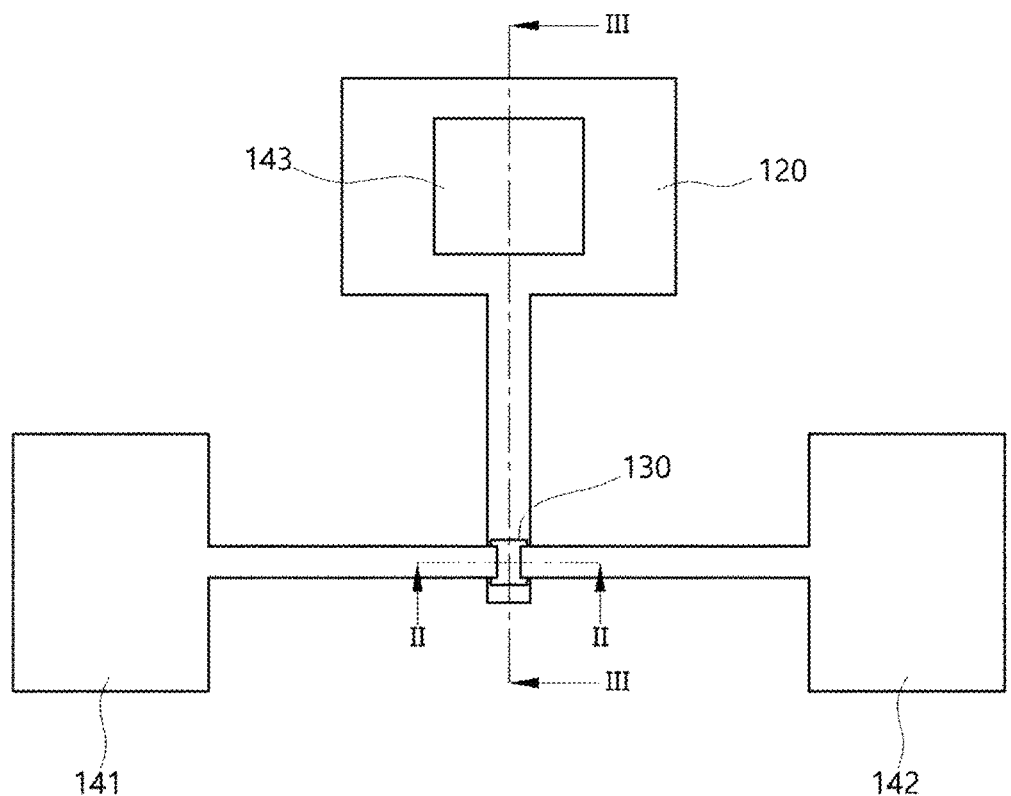
FIG. 1 is a plan view of a synaptic transistor according to a first exemplary embodiment of the present invention.
Figure 2:
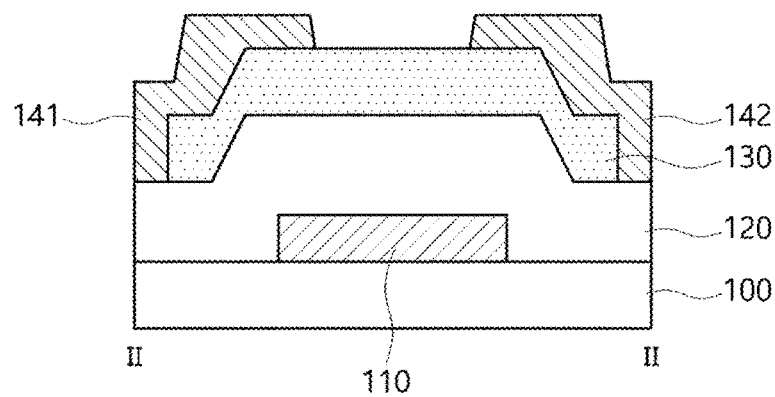
FIG. 2 is a cross-sectional view taken along Section Line II-II of FIG. 1.
Figure 3:
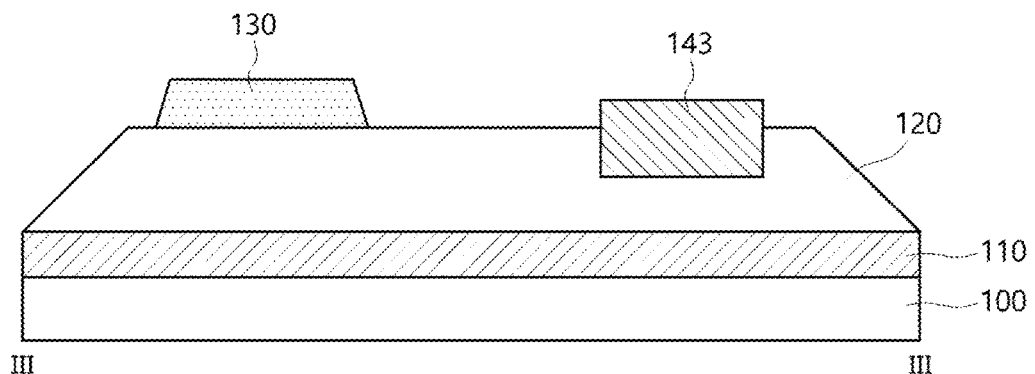
FIG. 3 is a cross-sectional view taken along Section Line III-III of FIG. 1.

FIG. 1 is a plan view of a synaptic transistor according to a first exemplary embodiment of the present invention, FIG. 2 is a cross-sectional view taken along Section Line II-II of FIG. 1, and FIG. 3 is a cross-sectional view taken along Section Line III-III of FIG. 1.

Referring to FIGS. 1 to 3, the synaptic transistor according to a first exemplary embodiment of the present invention may be configured by including a substrate 100, an expansion gate electrode 110, a gate insulating layer 120, a channel layer 130, source and drain electrodes 141 and 142 and a pad electrode 143.

The expansion gate electrode 110 is disposed to extend in one direction on the substrate 100, and the gate insulating layer 120 covers the expansion gate electrode 110 and is disposed on the substrate 100.

The channel layer 130 is disposed on the gate insulating layer 120 to correspond to one end of the expansion gate electrode 110, and the source electrode 141 and the drain electrode 142 are spaced apart from each other, cover both ends of the channel layer 130 and are disposed on the gate insulating layer 120. Herein, the channel layer 130 may be made of indium gallium zinc oxide (IGZO), which is an amorphous structure, and the gate electrode 110, the source and drain electrodes 141, 142 and the pad electrode 143 may be made of Cu, which is a conductive material, but are not limited thereto.

The pad electrode 143 is disposed on the gate insulating layer 120 to correspond to the other end of the expansion gate electrode 110.

Herein, the gate insulating layer 120 may be formed with a seating groove 121 in which the pad electrode 120 is seated to correspond to the other end of the expansion gate electrode 110, and the pad electrode 143 may be seated in the seating grooves 121 formed in the gate insulation layer 120.

The gate insulating layer 120 includes ions, and these ions may be hydrogen ions.

To this end, the gate insulating layer 120 may be made of $Al_2O_3$ laminated by atomic layer deposition (ALD). In this case, the gate insulating layer 120 forms a weak ionic bond of AlO—H by $H_2O$ used in the atomic layer deposition process. This ionic bond is separated by gate bias into $AlO^-$ and $H^+$ such that a large number of hydrogen ions are included in the gate insulating layer 120.

The hydrogen ions included in the gate insulating layer 120 move inside the gate insulation layer 120 in accordance with the gate bias applied to the pad electrode 143, and by adjusting the number of the hydrogen ions moved to the side of the channel layer 130, it induces a gating effect and at the same time induces hysteresis.

Figure 4:
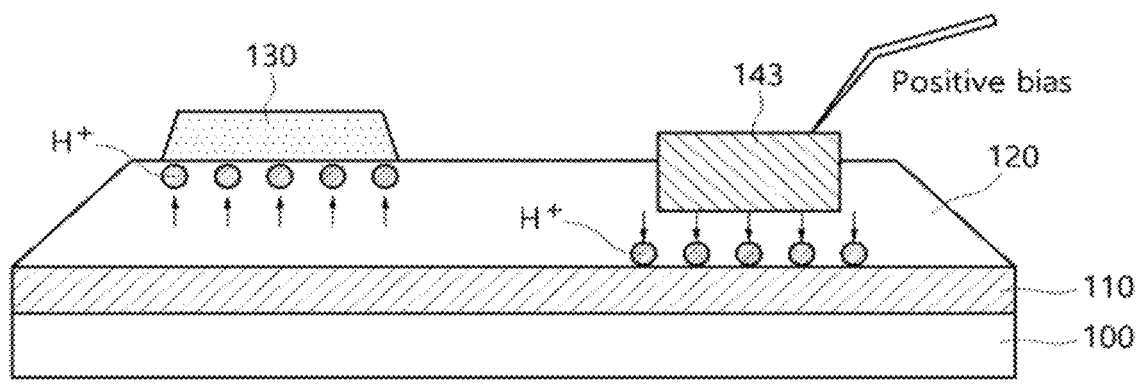
FIG. 4 is a diagram for describing the operation principle of a synaptic transistor according to the first exemplary embodiment of the present invention.
Figure 4:
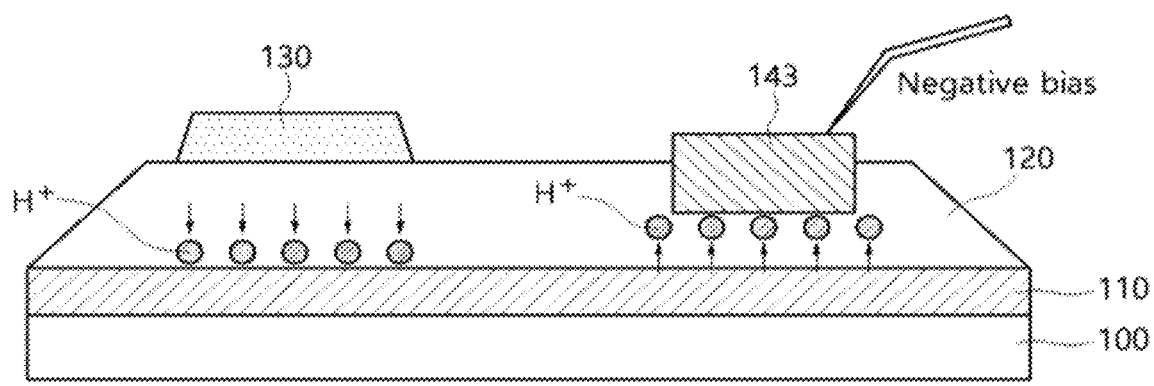

FIG. 4 is a diagram for describing the operation principle of a synaptic transistor according to the first exemplary embodiment of the present invention.

As illustrated in FIG. 4(a), when a positive bias is applied to the pad electrode 143, hydrogen ions ($H^+$) move from the side of the pad electrode 143 to the side of the channel layer 130. That is, when a positive bias is applied to the pad electrode 143, the hydrogen ions ($H^+$) inside the gate insulating layer 120 located below the pad electrode 143 move downward by the repulsive force thereof, and the hydrogen ions ($H^+$) inside the gate insulating layer 130 located below the channel layer 130 relatively move upward due to the moved hydrogen ions ($H^+$).

As such, as the number of hydrogen ions ($H^+$) adjacent to the channel layer 130 increases, the threshold voltage decreases and the electrical conductivity increases.

In contrast, as illustrated in FIG. 4(b), when a negative bias is applied to the pad electrode 143, hydrogen ions ($H^+$) move from the side of the channel layer 130 to the side of the pad electrode 143. That is, when a negative bias is applied to the pad electrode 143, the hydrogen ions ($H^+$) inside the gate insulating layer 120 located below the pad electrodes 143 move upward by the attraction force thereof, and the hydrogen ions ($H^+$) inside the gate insulating layer 130 located below the channel layer 130 relatively move downward due to the moved hydrogen ions ($H^+$).

As such, as the number of hydrogen ions ($H^+$) adjacent to the channel layer 130 decreases, the threshold voltage increases and the electrical conductivity decreases.

The synaptic transistor according to the first exemplary embodiment of the present invention is characterized in that hysteresis and the synaptic characteristics are adjusted according to the area of the channel layer 130 and the thickness of the gate insulating layer 120 disposed below the pad electrode 143.

Specifically, in the synaptic transistor according to the first exemplary embodiment of the present invention, as the area of the channel layer 130 increases and the thickness of the gate insulating layer 120 disposed below the pad electrode 143 increases, more hydrogen ions are included inside the gate insulation layer 120, and the distance over which the hydrogen ions can move is increased, resulting in greater hysteresis.

This greater hysteresis makes it possible to have a relatively high signal-to-noise ratio by providing immunity to a change in the threshold voltage $V_T$ occurring in the manufacturing process of synaptic transistors.

The hysteresis ($V_{hysteresis}$) of the synaptic transistor according to the first exemplary embodiment of the present invention may be defined by Mathematical Formula 1 below.

$$V_{hysteresis} = \frac{Q_{ox1} A_1 T_{ox1}^2 + Q_{ox2} A_2 T_{ox2}^2}{\varepsilon_{ox}} \quad \langle \text{Mathematical Formula 1} \rangle$$

Herein, $Q_{ox1}$ is the total amount of ions included in the gate insulating layer 120 disposed below the pad electrode 143, $Q_{ox2}$ is the entire amount of ions included in the gate insulating layer 120 located below the channel layer 130, and $\varepsilon_{ox}$ is the dielectric constant of the gate insulation layer 120.

According to Mathematical Formula 1 above, it can be confirmed that the hysteresis ($V_{hysteresis}$) of the synaptic transistor is determined by the area $A_1$ of the pad electrode 143, the area $A_2$ of the channel layer 130, the thickness $T_{ox1}$ of the gate insulating layer 120 disposed below the pad electrode 143 and the thickness $T_{ox2}$ of the gate insulating layer 120 located below the channel layer 130.

In particular, it can be confirmed that as the area $A_2$ of the channel layer 130 increases and the thickness $T_{ox1}$ of the gate insulating layer 120 disposed below the pad electrode 143 increases, the hysteresis ($V_{hysteresis}$) of the synaptic transistor increases.

Figure 5:
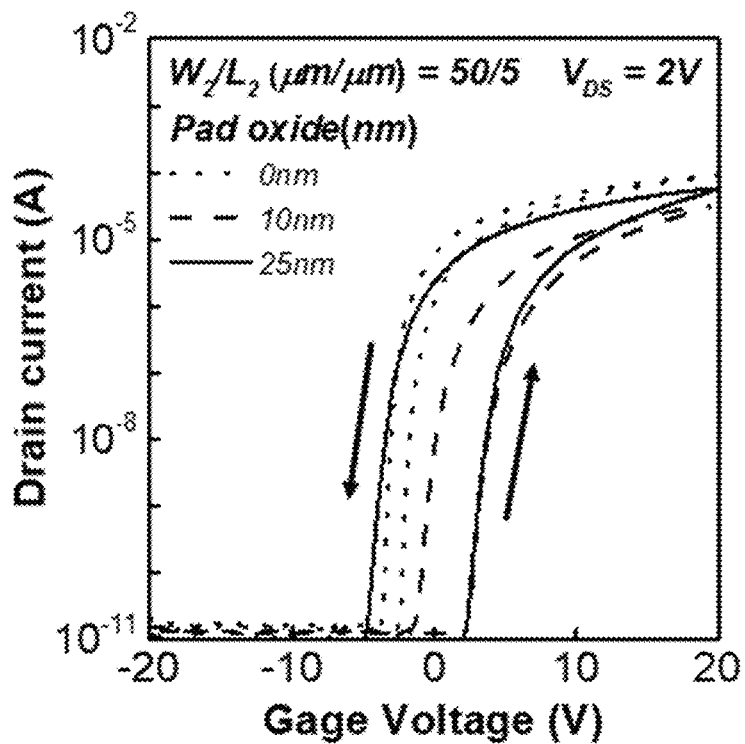
FIG. 5 is a graph showing the drain-source current with respect to the gate voltage according to the thickness of a gate insulating layer disposed below a pad electrode.
Figure 6:
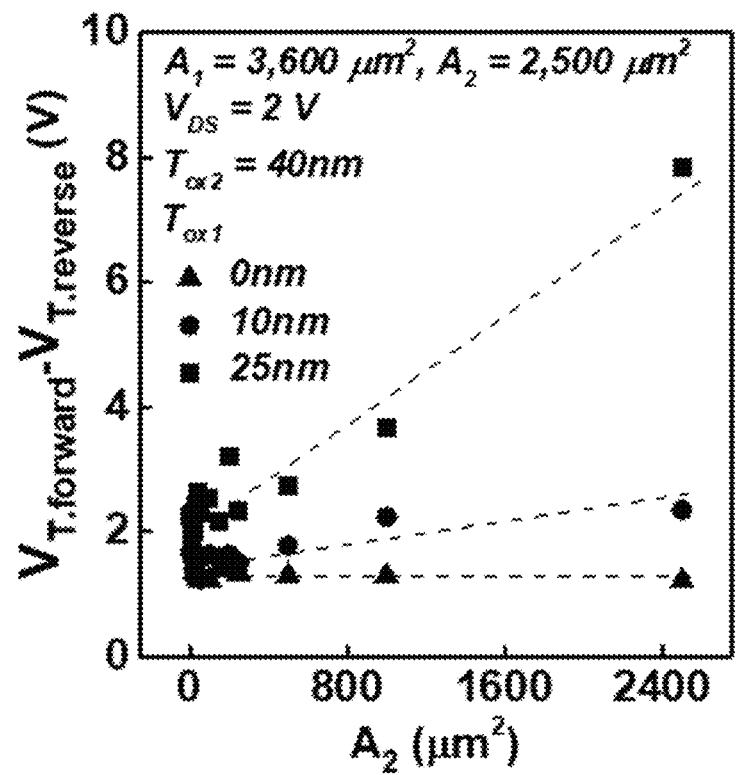
FIG. 6 is a graph showing the threshold voltage difference with respect to the area of the channel layer according to the thickness of a gate insulating layer disposed below a pad electrode.

FIG. 5 is a graph showing the drain-source current with respect to the gate voltage according to the thickness of a gate insulating layer disposed below a pad electrode, and FIG. 6 is a graph showing the threshold voltage difference with respect to the area of the channel layer according to the thickness of a gate insulating layer disposed below a pad electrode.

Referring to FIG. 5, the width W2 and the length $L_2$ of the channel layer 130 were formed to be 50 μm, respectively, and the thickness $T_{ox1}$ of the gate insulating layer (pad oxide) 120 disposed below the pad electrode 143 was formed to be 0, 10 and 25 nm, respectively. Then, the gate-source voltage $V_{GS}$ was applied in a range of −20 to 20 V in a state where the source-drain voltage $V_{DS}$ was applied at 2V for each thickness $T_{ox1}$ of the gate insulating layer (pad oxide) 120, and the drain-source current $I_{DS}$ was measured.

As a result of the measurement, it was experimentally confirmed that as the thickness $T_{ox1}$ of the gate insulating layer (pad oxide) 120 increased, the hysteresis increased.

Referring to FIG. 6, differences in the forward threshold voltage $V_{T.forward}$ and the reverse threshold voltage $V_{T.reverse}$ were measured for each thickness $T_{ox1}$ of the gate insulating layer (pad oxide) 120 while changing the area $A_2$ of the channel layer 130 in a range of 1 to 2,500 μm² after forming the thickness $T_{ox1}$ of the gate insulating layer 120 disposed below the pad electrode 143 to be 0, 10 and 25 nm, respectively.

As a result of the measurement, it was experimentally confirmed that as the area $A_2$ of the channel layer 130 increased, the difference between the forward threshold voltage $V_{T.forward}$ and the reverse threshold voltage $V_{T.reverse}$, that is, hysteresis, increased. In particular, it was confirmed that as the thickness $T_{ox1}$ of the gate insulating layer (pad oxide) 120 increased, the hysteresis increase rate further increased.

In the synaptic transistor according to the first exemplary embodiment of the present invention, as the thickness of the gate insulating layer 120 disposed below the pad electrode 143 increases, the gating effect by hydrogen ions increases, and as the area of the channel layer 130 becomes smaller, the increase width of the drain current becomes larger, and thus, the synaptic characteristics may be improved.

Figure 7:
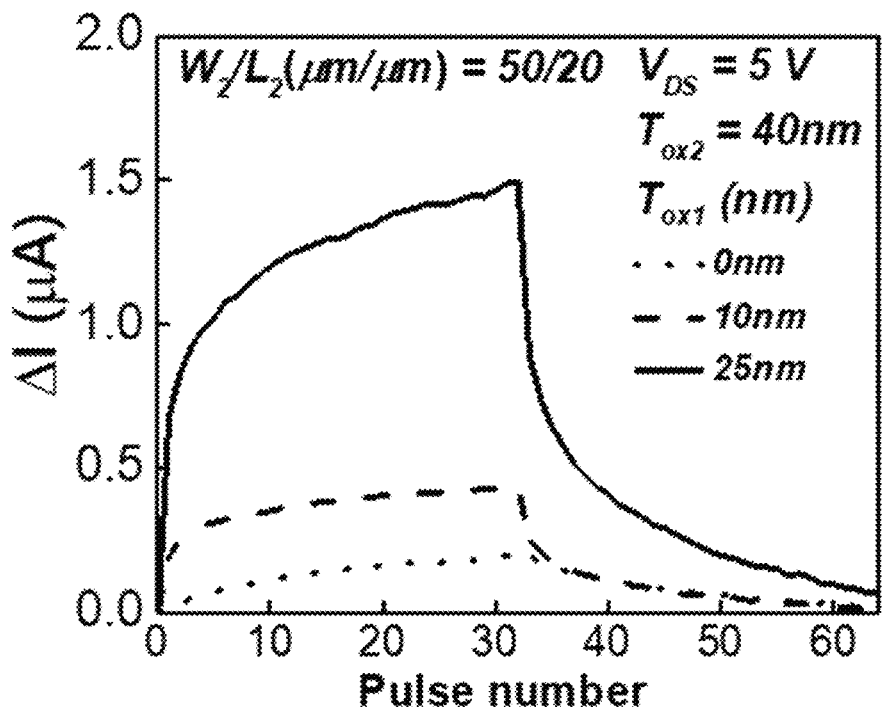
FIG. 7 is a graph showing the amount of current change with respect to the number of pulses according to the thickness of a gate insulating layer disposed below a pad electrode.
Figure 8:
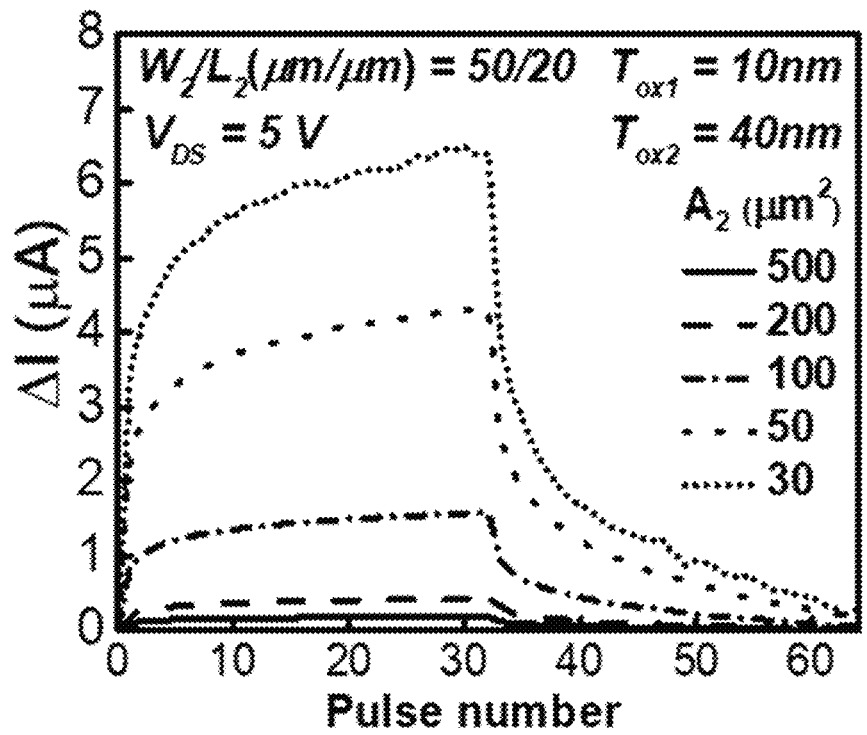
FIG. 8 is a graph showing the amount of current change with respect to the number of pulses according to the area of a channel layer.

FIG. 7 is a graph showing the amount of current change with respect to the number of pulses according to the thickness of a gate insulating layer disposed below the pad electrode, and FIG. 8 is a graph showing the amount of current change with respect to the number of pulses according to the area of a channel layer.

Referring to FIG. 7, the width W2 and the length $L_2$ of the channel layer 130 were formed to be 50 μm and 20 μm, respectively, and the thicknesses $T_{ox1}$ of the gate insulating layer (pad oxide) 120 disposed below the pad electrode 143 were formed to be 0, 10 and 25 nm, respectively. Then, pulses were applied in a range of 0 to 32 for each thickness $T_{ox1}$ of the gate insulating layer (pad oxide) 120, and the current change amount ΔI was measured.

As a result of the measurement, it was experimentally confirmed that as the thickness $T_{ox1}$ of the gate insulating layer (pad oxide) 120 increased, the current change amount ΔI corresponding to the number of pulses increased.

Referring to FIG. 8, the thickness $T_{ox1}$ of the gate insulating layer (pad oxide) 120 disposed below the pad electrode 143 was formed to be 10 nm, and the areas $A_2$ of the channel layer 130 were formed to be 20, 50, 100, 200 and 500 μm². Then, pulses were applied in a range of 0 to 32 for each area $A_2$ of the channel layer 130, and the current change amount ΔI was measured.

As a result of the measurement, it was experimentally confirmed that the smaller the area $A_2$ of the channel layer 130, the larger the current change amount ΔI corresponding to the number of pulses.

As described above, in the synaptic transistor according to the first exemplary embodiment of the present invention, as the thickness of the gate insulating layer 120 disposed below the pad electrode 143 increases, the gating effect by hydrogen ions increases, and as the area of the channel layer 130 becomes smaller, the increase width of the drain current increases, and thus, the synaptic characteristics may be improved.

In addition, the synaptic transistor according to the first exemplary embodiment of the present invention may improve energy efficiency, which is an important indicator of neuromorphic computing, due to improved synaptic characteristics.

FIGS. 9A to 9D are diagrams for describing the manufacturing method of a synaptic transistor according to the first exemplary embodiment of the present invention with reference to FIG. 2, and FIGS. 10A to 10E are diagrams for describing the manufacturing method of a synaptic transistor according to the first exemplary embodiment of the present invention with reference to FIG. 3.

Figure 9A:
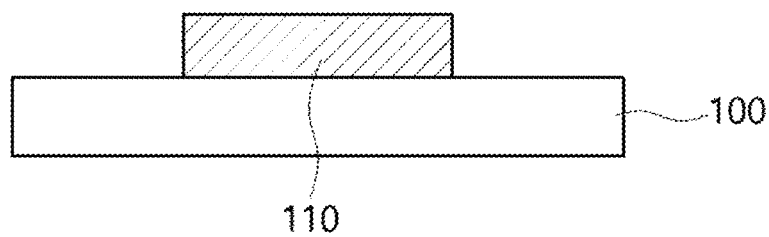
FIGS. 9A to 9D are diagrams for describing the manufacturing method of a synaptic transistor according to the first exemplary embodiment of the present invention with reference to FIG. 2.
Figure 10A:
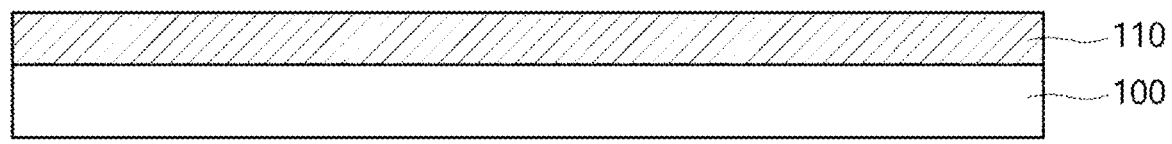
FIGS. 10A to 10E are diagrams for describing the manufacturing method of a synaptic transistor according to the first exemplary embodiment of the present invention with reference to FIG. 3.

First, referring to FIGS. 9A and 10A, the expansion gate electrode 110 is formed to extend in one direction on the substrate 100. For example, Cu may be melted using the electron beam vacuum evaporation (e-beam evaporator) to form an expansion gate electrode 110 having a thickness of about 20 nm on the substrate 100.

Figure 9B:
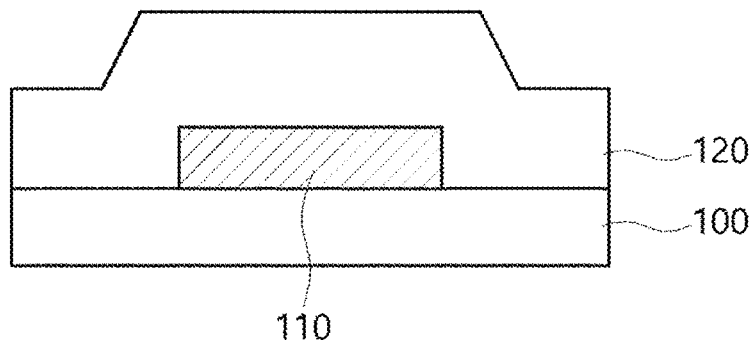
Figure 10B:
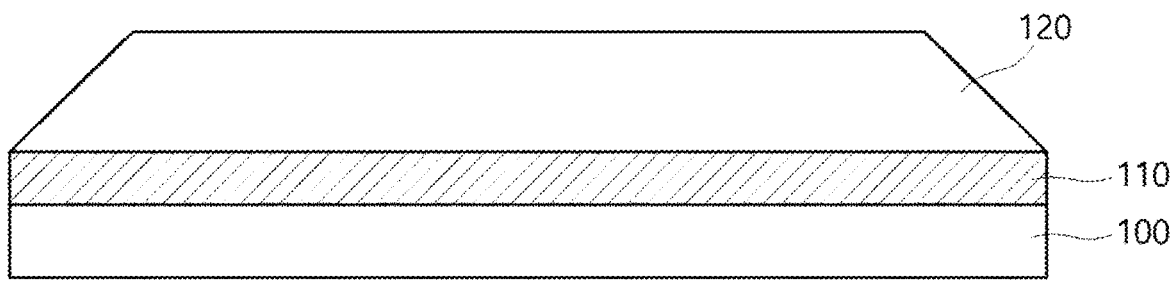

Next, referring to FIGS. 9B and 10B, the gate insulating layer 120 is formed on the substrate 100 so as to cover the expansion gate electrode 110. In this case, the gate insulating layer 120 may include hydrogen ions.

For example, atomic layer epitaxy (ALD) may be used to deposit $Al_2O_3$ to a thickness of about 40 nm to form a gate insulating layer 120. In this case, the gate insulating layer 120 forms a weak ionic bond of AlO—H by $H_2O$ used in the atomic layer deposition process. This ionic bond is separated by gate bias into AlO⁻ and H⁺ such that a large number of hydrogen ions are included in the gate insulating layer 120.

Figure 10C:
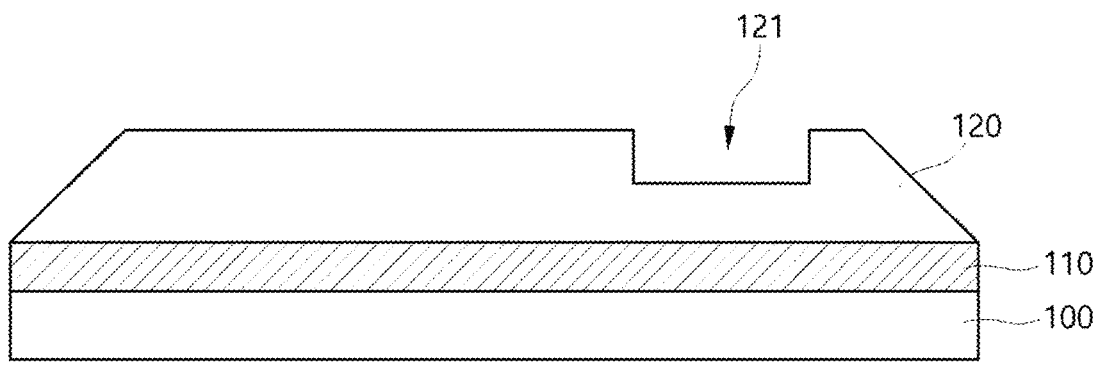

Next, referring to FIG. 10C, a seating groove 121 is formed in the gate insulating layer 120 to correspond to the other end of the expansion gate electrode 110. For example, the gate insulating layer 120 may be etched to a depth of about 30 nm using the buffered oxide etch (BOE) etching process to form a seating groove 121.

Figure 9C:
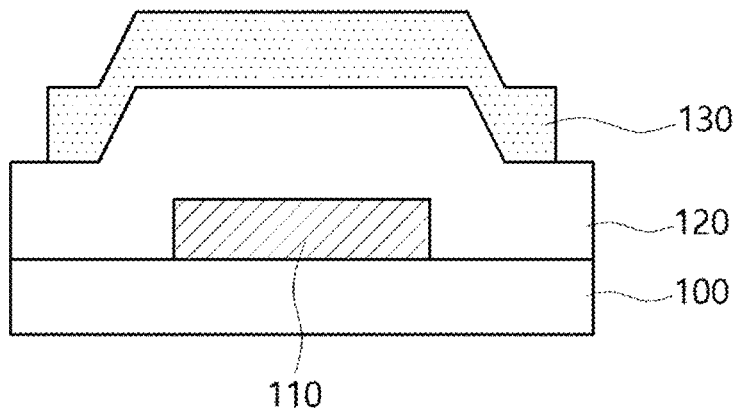
Figure 10D:
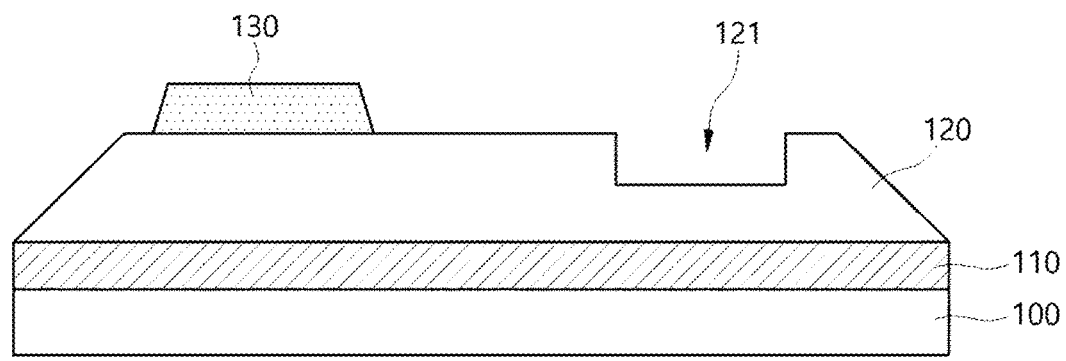

Next, referring to FIGS. 9C and 10D, a channel layer 130 is formed on the gate insulating layer 120 to correspond to one end of the expansion gate electrode 110. For example, the channel layer 130 may be formed by depositing IGZO to a thickness of about 35 nm using the sputtering technique.

Figure 9D:
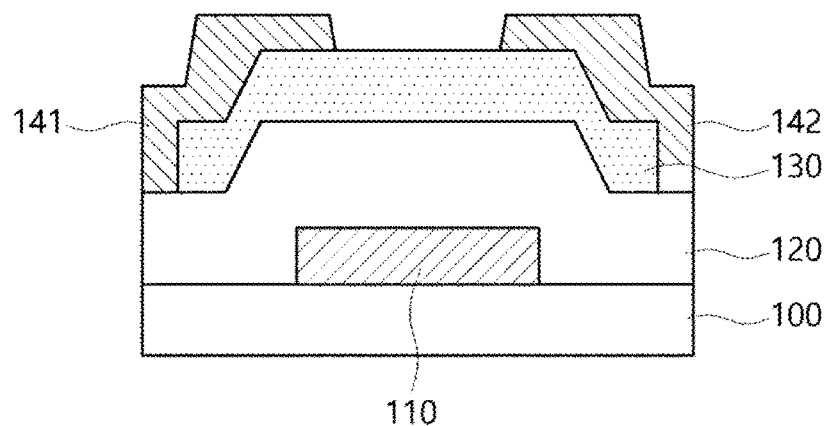
Figure 10E:
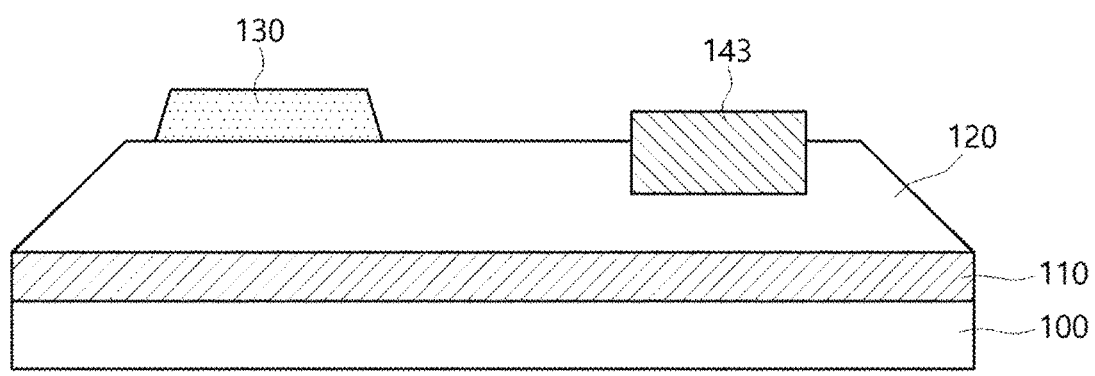

Next, referring to FIGS. 9D and 10E, a source electrode 141 and a drain electrode 142 are formed on the gate insulating layer 120 so as to cover both ends of the channel layer 130, and a pad electrode 143 is formed in the seating groove 121. For example, the source and drain electrodes 141 and 142 and the pad electrode 143 may be formed to a thickness of about 30 nm above the gate insulating layer 120 by melting Cu using the electron beam vacuum evaporation (e-beam evaporator).

Figure 11:
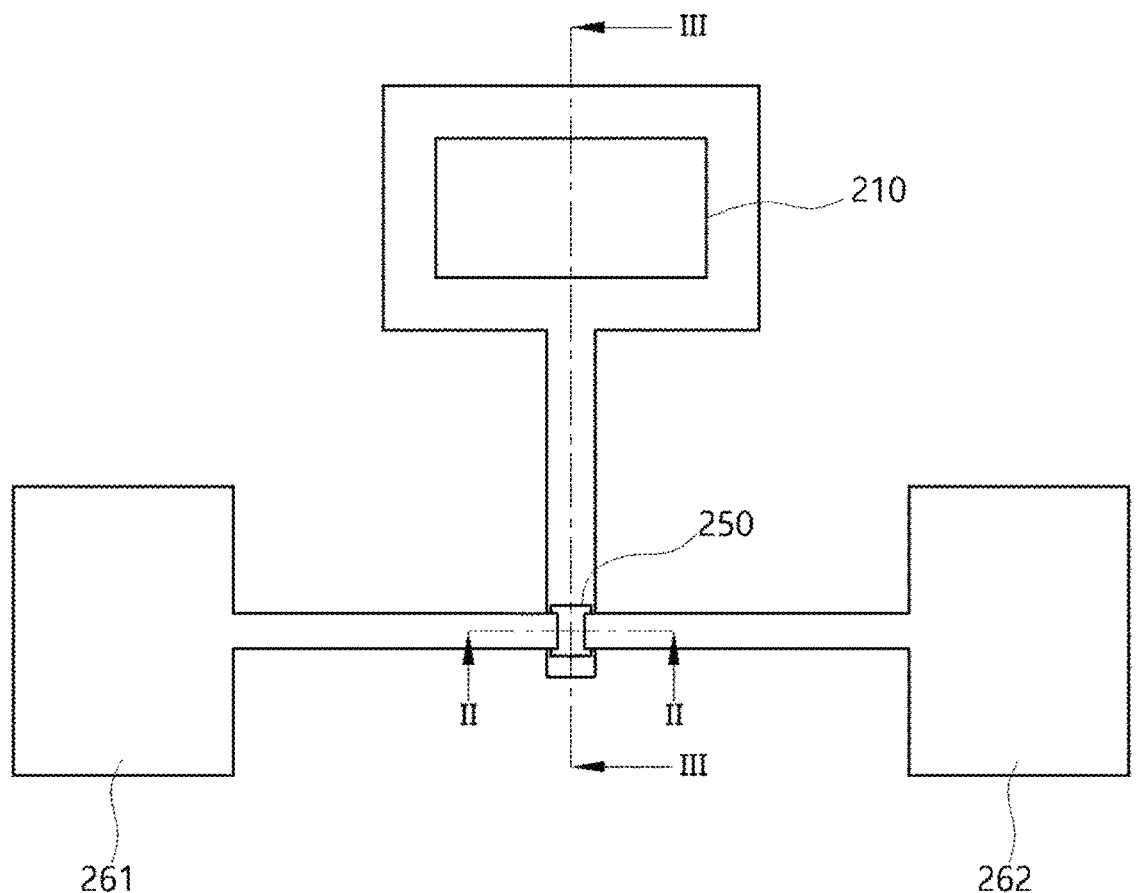
FIG. 11 is a plan view of the synaptic transistor according to a second exemplary embodiment of the present invention.
Figure 12:
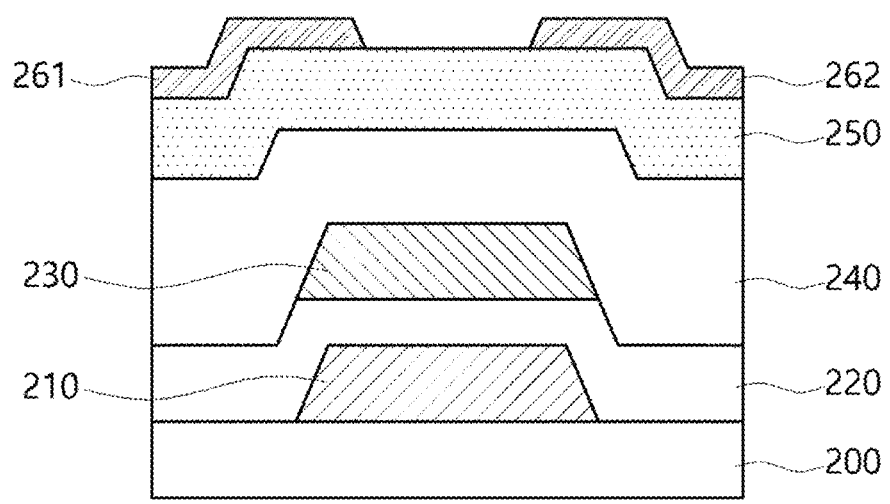
FIG. 12 is a cross-sectional view taken along Section Line II-II of FIG. 11.
Figure 13:
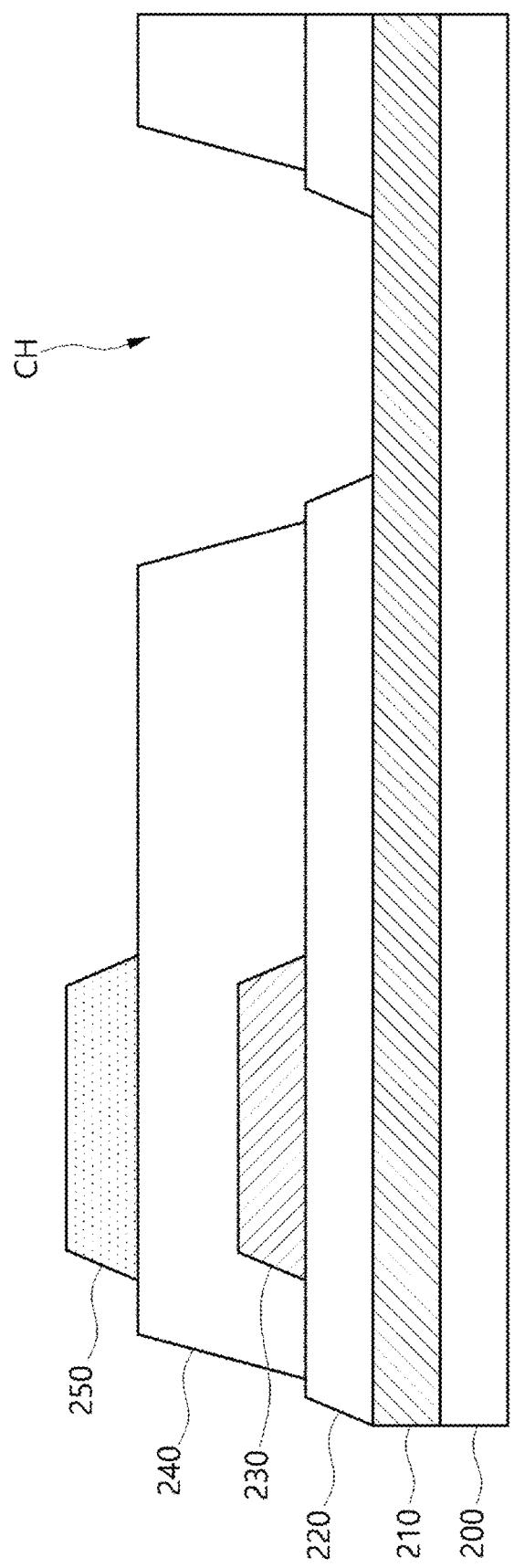
FIG. 13 is a cross-sectional view taken along Section Line III-III of FIG. 11.

FIG. 11 is a plan view of the synaptic transistor according to a second exemplary embodiment of the present invention, FIG. 12 is a cross-sectional view taken along Section Line II-II of FIG. 11, and FIG. 13 is a cross-sectional view taken along Section Line III-III of FIG. 11.

Referring to FIGS. 11 to 13, as a synaptic transistor with long-term and short-term memory characteristics, the synaptic transistor according to a second exemplary embodiment of the present invention may be configured by including a substrate 200, a bottom gate electrode 210, a first gate insulating layer 220, a floating gate electrode 230, a second gate insulation layer 240, a channel layer 250 and source and drain electrodes 261 and 262.

The bottom gate electrode 210 is disposed to extend in one direction on the substrate 200, and the first gate insulating layer 220 covers the bottom gate electrode 210 and is disposed on the substrate 200.

The floating gate electrode 230 is disposed on the first gate insulating layer 220 to correspond to the bottom gate electrode 210, and the second gate insulation layer 240 covers the floating gate electrode 230 and is disposed on the first gate insulating layer 220.

The channel layer 250 is disposed on the second gate insulating layer 240 to correspond to the floating gate electrode 230, and the source electrode 261 and the drain electrode 262 are spaced apart from each other, cover both ends of the channel layer 250 and are disposed on the second gate insulating layer 240. Herein, the channel layer 250 may be made of indium gallium zinc oxide (IGZO), which is an amorphous structure, and the bottom gate electrode 210, the floating gate electrode 230, the source electrode 261 and the drain electrode 262 may be made of Cu, which is a conductive material, but are not limited thereto.

The first gate insulating layer 220 and the second gate insulating layer 240 include ions, and these ions may be hydrogen ions.

To this end, the first and second gate insulating layers 220, 240 may be made of $Al_2O_3$ laminated by low-temperature atomic layer deposition (ALD). In this case, the first and second gate insulating layers 220, 240 form a weak ionic bond of AlO—H by $H_2O$ used in the low-temperature atomic layer deposition process. This ionic bond is separated by gate bias into $AlO^-$ and $H^+$ such that a large number of hydrogen ions are included in the first and second gate insulating layers 220, 240.

The hydrogen ions included in the first and second gate insulating layers 220, 240 move inside the first gate insulating layer 220, 240 in accordance with the gate bias applied to the bottom gate electrode 210, and by adjusting the number of the hydrogen ions moved towards the channel layer 250, it induces a gating effect and at the same time induces hysteresis.

The first and second gate insulating layers 220, 240 are formed with contact holes CH that expose a portion of the bottom gate electrode 220 at positions spaced apart by a certain distance from the channel layer 250.

Figure 14A:
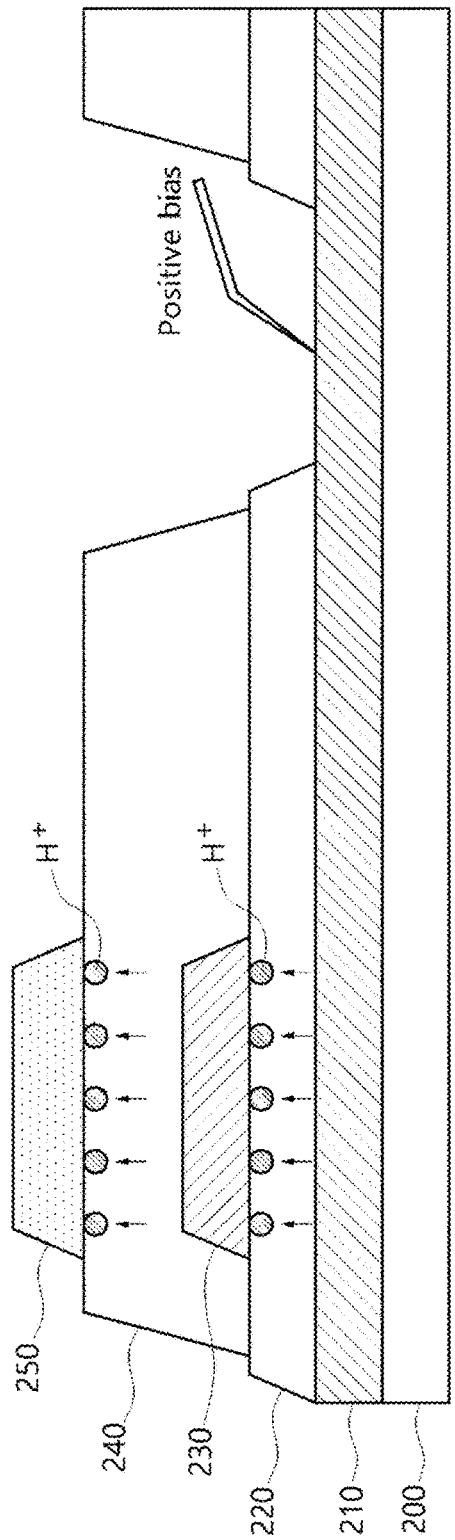
FIG. 14A and FIG. 14B is a diagram for describing the operation principle of the short-term memory characteristics of a synaptic transistor according to the second exemplary embodiment of the present invention.
Figure 14A:
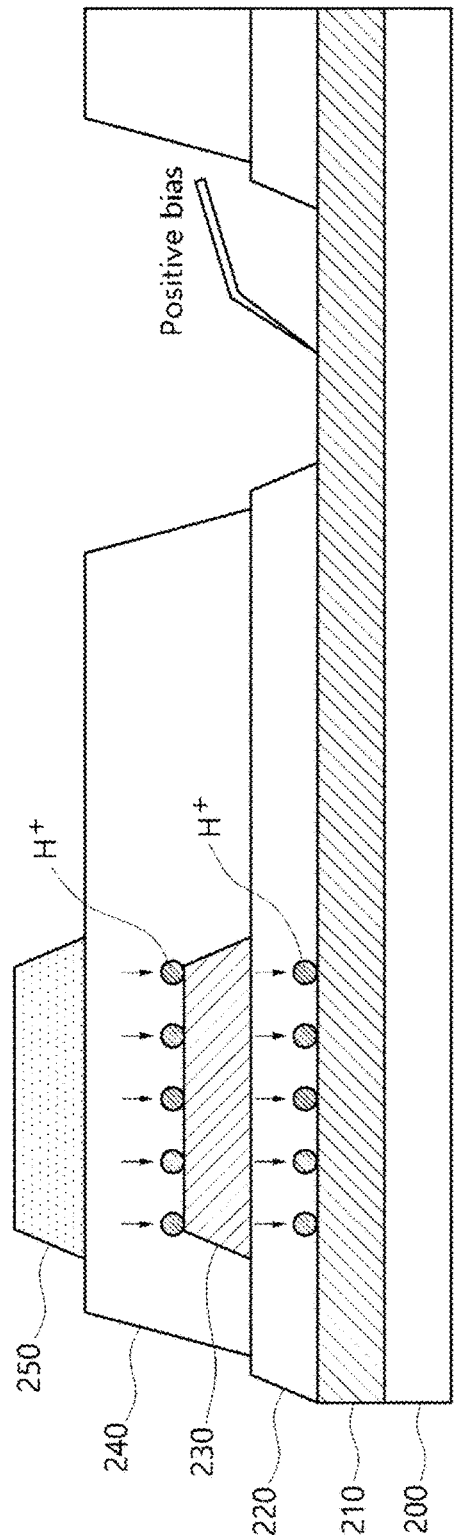
Figure 14B:
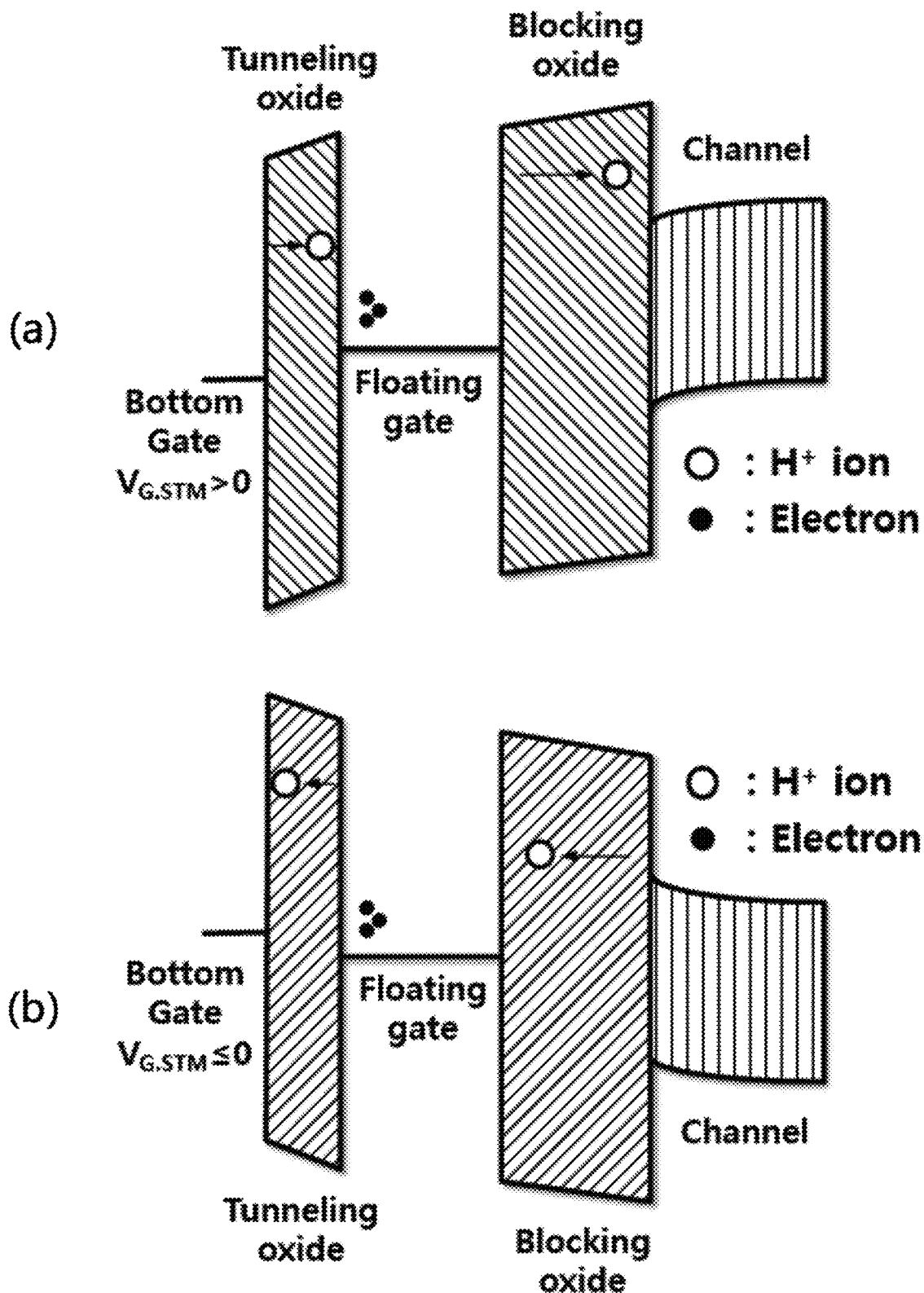

FIG. 14A and FIG. 14B is a diagram for describing the operation principle of the short-term memory characteristics of a synaptic transistor according to the second exemplary embodiment of the present invention.

FIG. 14B (a) is an energy band diagram linked to FIG. 14A (a). And FIG. 14B (b) is an energy band diagram linked to FIG. 14A (b).

As illustrated in FIG. 14A (a) and FIG. 14B (a), when a positive bias less than a reference voltage is applied to the bottom gate electrode 210 exposed by the contact hole CH, hydrogen ions $H^+$ move from the side of the bottom gate electrode 210 to the side of the channel layer 250. That is, when a positive bias is applied to the bottom gate electrode 210, the hydrogen ions ($H^+$) inside the first gate insulating layer 220 located above the bottoms gate electrode 210 move upward by the repulsive force thereof, and the hydrogen ions ($H^+$) inside the second gate insulation layer 240 located above the floating gate electrode 230 move upward by the repulsive force thereof. Accordingly, as the number of hydrogen ions ($H^+$) adjacent to the channel layer 250 increases, the threshold voltage decreases and the electrical conductivity increases.

Herein, the reference voltage means a voltage at which electrons included in the floating gate electrode 230 may move over the first gate insulating layer 220 to the bottom gate electrode 210.

On the other hand, as illustrated in FIG. 14A (b) and FIG. 14B (b), when a negative bias is applied to the bottom gate electrode 210 exposed by the contact hole CH, hydrogen ions ($H^+$) move from the side of the channel layer 250 to the side of the bottom gate electrode 210. That is, when a negative bias is applied to the bottom gate electrode 210, the hydrogen ions ($H^+$) inside the first gate insulating layer 220 located below the floating gate electrode 230 move downward by the attractive force thereof, and the hydrogen ions ($H^+$) inside the second gate insulating layers 240 located below the channel layer 250 move downward by the attractive force thereof. Accordingly, as the number of hydrogen ions ($H^+$) adjacent to the channel layer 250 decreases, the threshold voltage increases and the electrical conductivity decreases.

Herein, the reference voltage means a voltage at which electrons included in the bottom gate electrode 210 may move over the first gate insulating layer 220 to the floating gate electrode 230.

According to such an operation principle, the synaptic transistor according to the second exemplary embodiment of the present invention may perform the operation of short-term memory characteristics.

Figure 15:
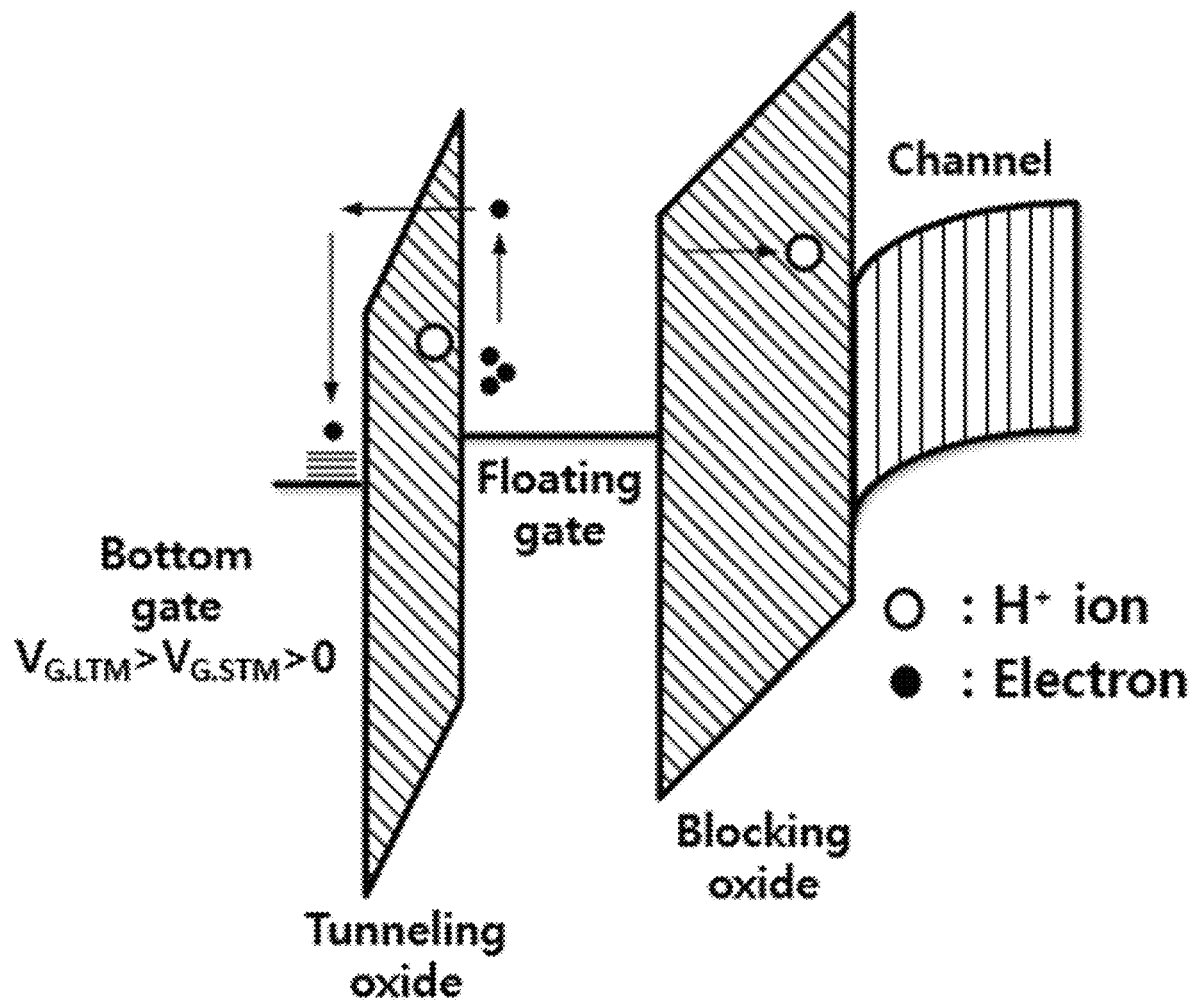
FIG. 15 is a diagram for describing the operation principle of writing of the long-term memory characteristics of a synaptic transistor according to the second exemplary embodiment.
Figure 16:
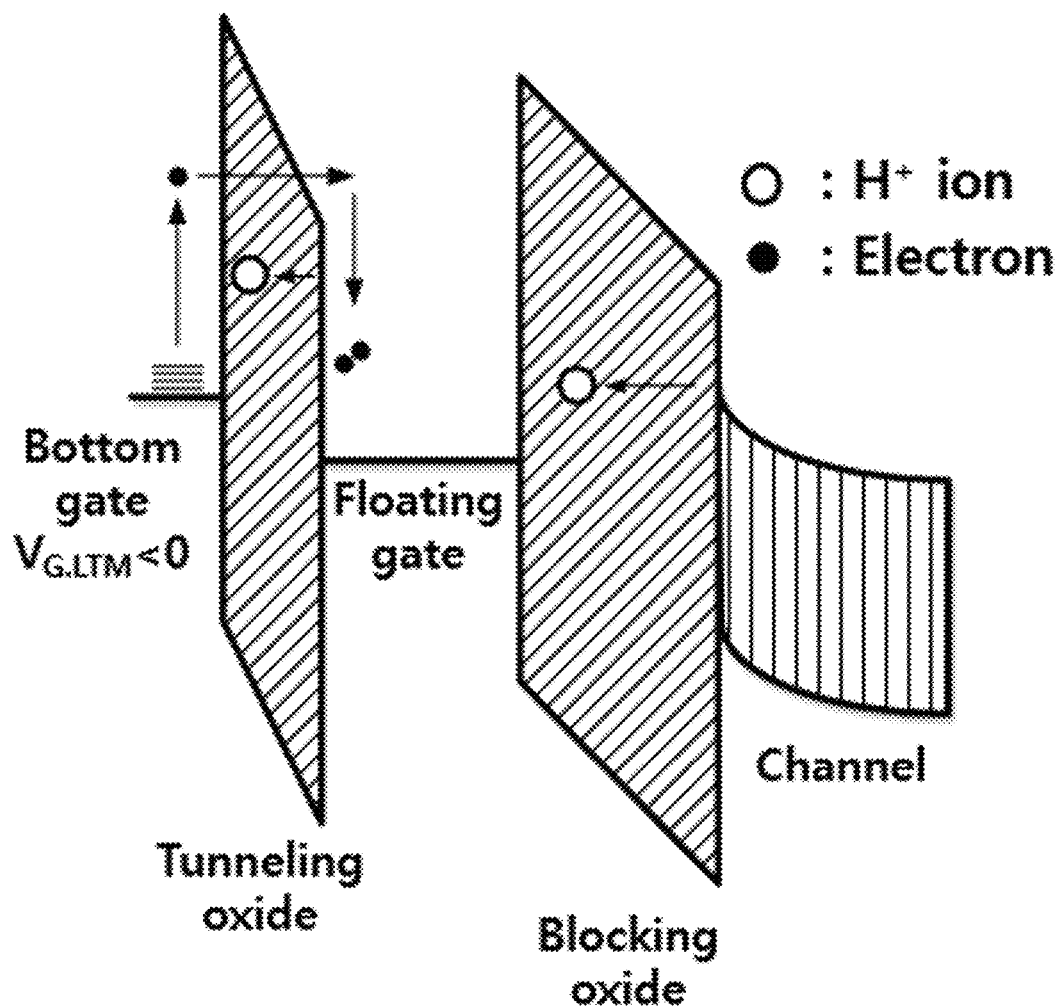
FIG. 16 is a diagram for describing the operation principle of erasing of the long-term memory characteristics of a synaptic transistor according to the second exemplary embodiment of the present invention.

FIG. 15 is a diagram for describing the operation principle of writing of the long-term memory characteristics of a synaptic transistor according to the second exemplary embodiment, and FIG. 16 is a diagram for describing the operation principle of erasing of the long-term memory characteristics of a synaptic transistor according to the second exemplary embodiment of the present invention.

The synaptic transistor according to the second exemplary embodiment of the present invention is made to exhibit long-term memory characteristics using the Fowler Nordheim (FN) tunneling mechanism.

Specifically, as illustrated in FIG. 15, when a positive bias greater than or equal to a reference voltage is applied to the bottom gate electrode 210, the electrons (e) included in the floating gate electrode 230 move over the first gate insulating layer 220 to the bottom gate electrode 210. Then, the moved electrons (e) are trapped by the bottom gate electrode 210 such that the threshold voltage of the channel layer 250 decreases and the electric conductivity increases.

Herein, the reference voltage means a voltage at which electrons included in the floating gate electrode 230 may move over the first gate insulating layer 220 to the bottom gate electrode 210.

According to such an operation principle, the synaptic transistor according to the second exemplary embodiment of the present invention may perform the operation of writing of long-term memory characteristics.

Unlike the above, as illustrated in FIG. 16, when a positive bias greater than or equal to a reference voltage is applied to the bottom gate electrode 210, the electrons (e) included in the bottom gate electrode 210 move over the first gate insulating layer (tunneling oxide) 220 to the floating gate electrode 230. Then, the moved electrons (e) are trapped by the floating gate electrode 230 such that the threshold voltage of the channel layer 250 increases and the electrical conductivity decreases.

Herein, the reference voltage means a voltage at which electrons included in the bottom gate electrode 210 can move over the first gate insulating layer 220 to the floating gate electrode 230.

According to such an operation principle, the synaptic transistor according to the second exemplary embodiment of the present invention may perform the operation of erasing of long-term memory characteristics.

As described above, the synaptic transistor according to the second exemplary embodiment of the present invention may provide a synaptic transistor that may provide both short-term memory characteristics and long-term memory characteristics. That is, it is possible to provide short-term memory characteristics by the movement of hydrogen ions present inside the first and second gate insulating layer 220 and 240, and to provide long-term memory characteristics by charge trap inside the bottom gate 210 or floating gate 230.

FIGS. 17A to 17F are diagrams for describing the manufacturing method of a synaptic transistor according to the second exemplary embodiment of the present invention.

Figure 17A:
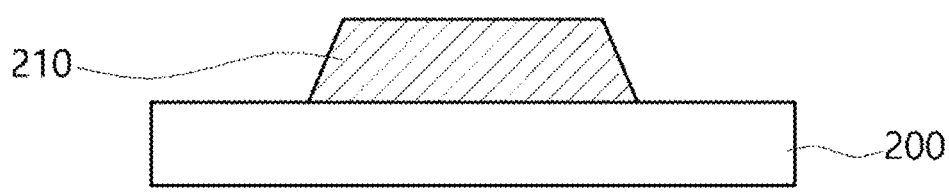
FIGS. 17A to 17F are diagrams for describing the manufacturing method of a synaptic transistor according to the second exemplary embodiment of the present invention.

First, referring to FIG. 17A, a bottom gate electrode 210 is formed on the substrate 200. For example, Cu may be melted using the electron beam vacuum evaporation (e-beam evaporator) to form a bottom gate electrode 210 having a thickness of about 20 nm on the substrate 200.

Figure 17B:
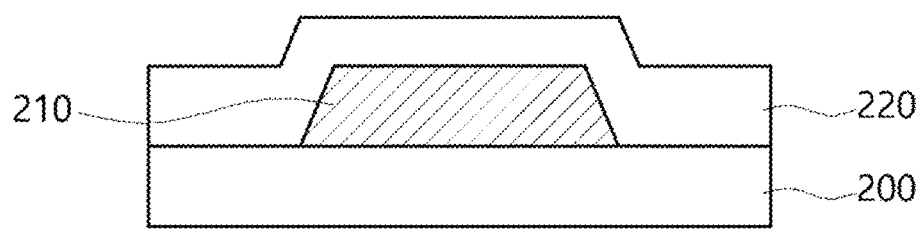

Next, referring to FIG. 17B, a first gate insulating layer 220 is formed on the substrate 200 so as to cover the bottom gate electrode 210. In this case, the first gate insulating layer 220 may include hydrogen ions.

For example, low-temperature atomic layer deposition (ALD) may be used to deposit $Al_2O_3$ to a relatively thin thickness of about 10 nm to form a first gate insulating layer 220. In this case, the first gate insulating layer 220 forms a weak ionic bond of AlO—H by $H_2O$ used in the atomic layer deposition process. This ionic bond is separated into $AlO^-$ and $H^+$ by gate bias such that a large number of hydrogen ions are included in the first gate insulation layer 220.

Figure 17C:
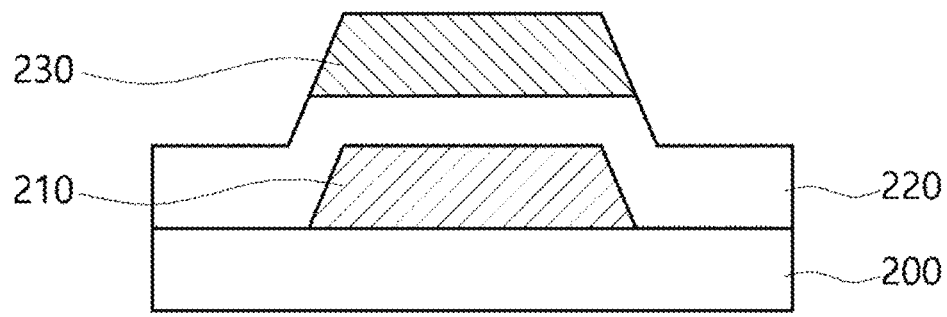

Next, referring to FIG. 17C, a floating gate electrode 230 is formed on the first gate insulating layer 220 to correspond to the bottom gate electrode 210. For example, the floating gate electrode 230 may be formed on the first gate insulating layer 220 by melting Cu using the electron beam vacuum evaporation (e-beam evaporator). In this case, the floating gate electrode 230 is preferably formed to be relatively thick with a thickness of about 30 nm to avoid interference with the channel layer 250 located thereon when electrons (e) are trapped in the floating gate electrode 230.

Figure 17D:
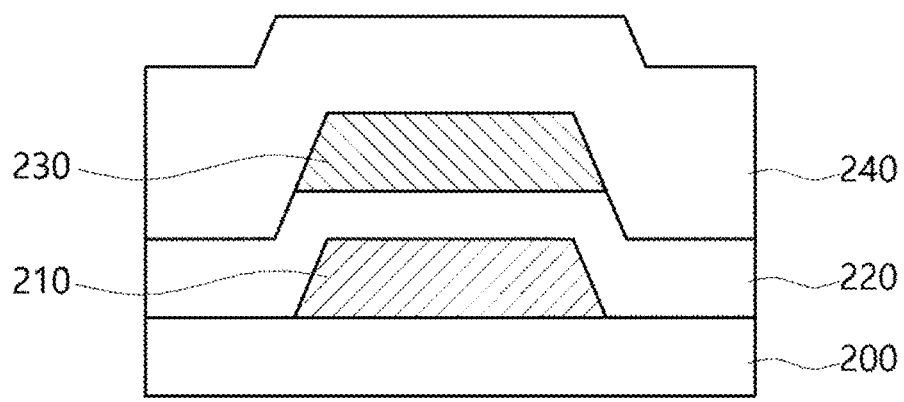

Next, referring to FIG. 17D, a second gate insulating layer 240 is formed on the first gate insulating layer 220 so as to cover the floating gate electrode 230. In this case, the second gate insulating layer 240 may include hydrogen ions.

For example, low-temperature atomic layer deposition (ALD) may be used to deposit $Al_2O_3$ to form a second gate insulating layer 240. In this case, the second gate insulating layer 240 is preferably formed to be relatively thick with a thickness of about 40 nm such that electrons (e) of the channel layer 250 do not pass to the floating gate electrode 230. In addition, the second gate insulating layer 240 forms a weak ionic bond of AlO—H by $H_2O$ used in the atomic layer deposition process. This ionic bond is separated into $AlO^-$ and $H^+$ by gate bias such that a large number of hydrogen ions are included in the second gate insulation layer 240.

Figure 17E:
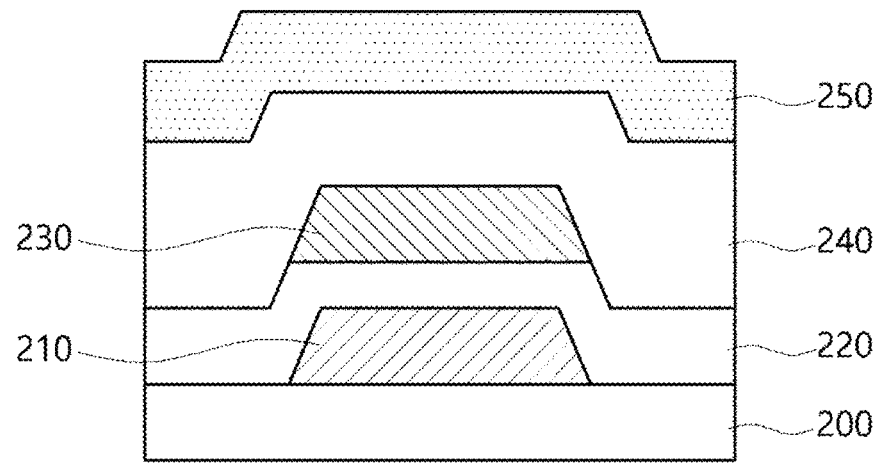

Next, referring to FIG. 17E, a channel layer 250 is formed on the second gate insulating layer 240 to correspond to the floating gate electrode 230. For example, the channel layer 250 may be formed by depositing IGZO to a thickness of about 35 nm using the sputtering technique.

Figure 17F:
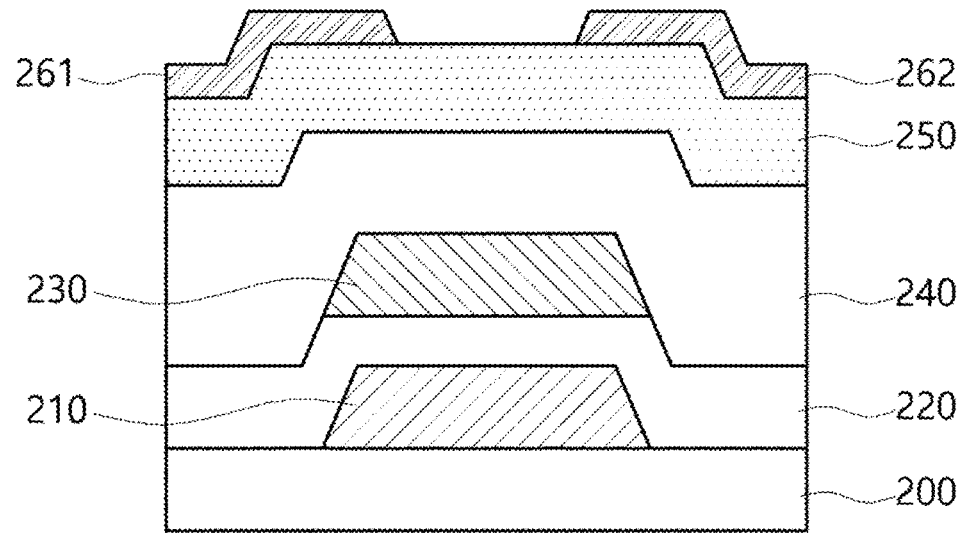

Next, referring to FIG. 17F, a source electrode 261 and a drain electrode 262 are formed to be spaced apart from each other on the second gate insulating layer 240 so as to cover both ends of the channel layer 250. For example, the source and drain electrodes 141, 142 may be formed to a thickness of about 30 nm on the second gate insulating layer 240 by melting Cu using the electron beam vacuum evaporation (e-beam evaporator).

Next, referring to FIG. 13, part of the bottom gate electrode 210 is exposed to the outside by etching the first and second gate insulating layers 220 and 240, which are at positions spaced apart from the channel layer 250 by a certain distance, to a depth of about 50 nm using the buffered oxide etch (BOE) process.

Figure 18:
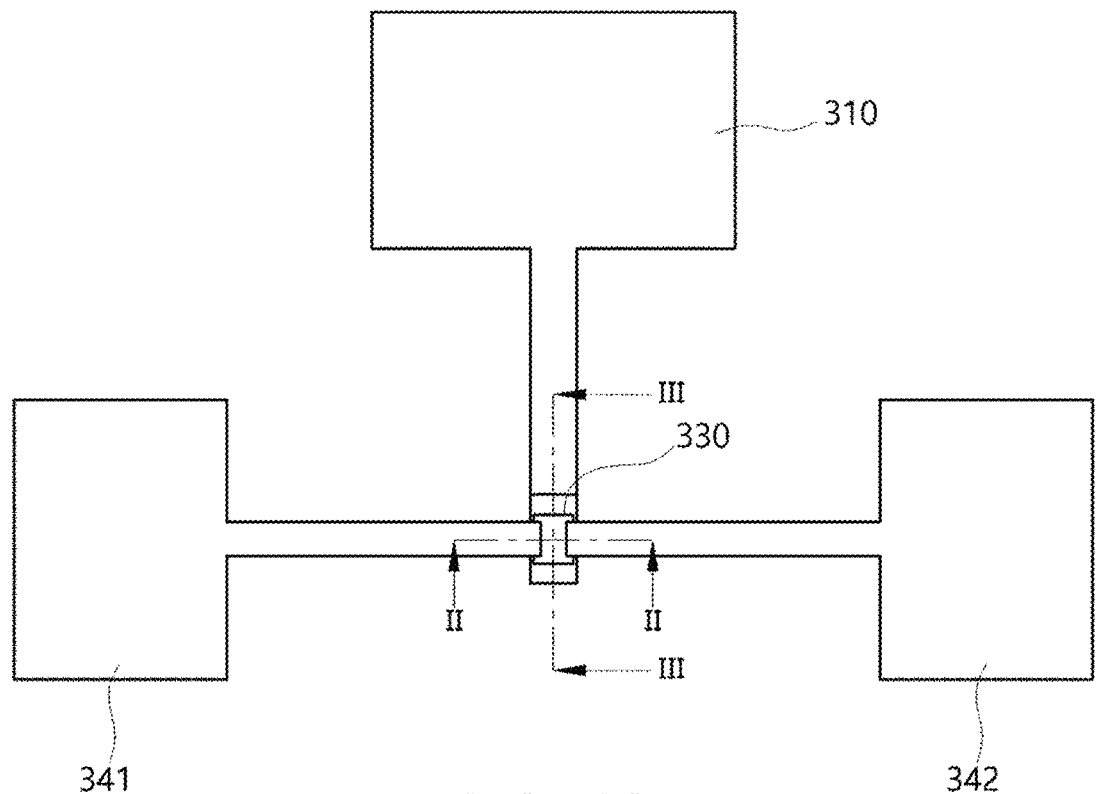
FIG. 18 is a plan view of the synaptic transistor according to a third exemplary embodiment of the present invention.
Figure 19:
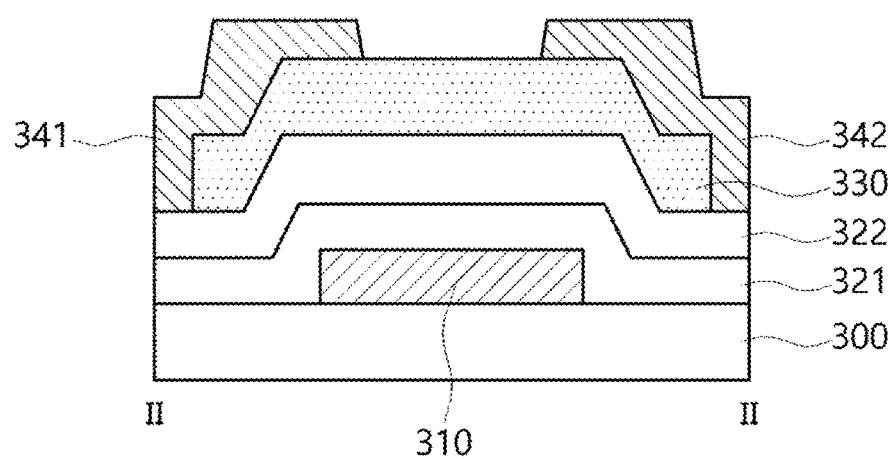
FIG. 19 is a cross-sectional view taken along Section Line II-II of FIG. 18.
Figure 20:
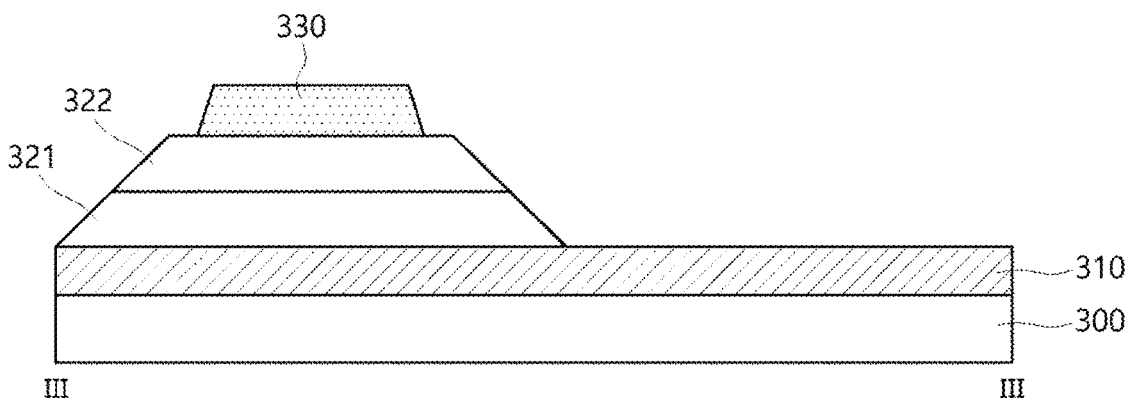
FIG. 20 is a cross-sectional view taken along Section Line III-III of FIG. 18.

FIG. 18 is a plan view of the synaptic transistor according to a third exemplary embodiment of the present invention, FIG. 19 is a cross-sectional view taken along Section Line II-II of FIG. 18, and FIG. 20 is a cross-sectional view taken along Section Line III-III of FIG. 18.

Referring to FIGS. 18 to 20, the synaptic transistor according to a third exemplary embodiment of the present invention may be configured by including a substrate 300, a gate electrode 310, a gate insulating layer 321, a retention layer 322, a channel layer 330, and source and drain electrodes 341 and 342.

The gate electrode 310 is disposed to extend in one direction on the substrate 300, the gate insulating layer 321 covers the gate electrode 310 and is disposed on the substrate 300, and the retention layer 322 is disposed on the gate insulating layers 321.

The channel layer 330 is disposed on the retention layer 322 to correspond to one end of the gate electrode 310, and the source electrode 341 and the drain electrode 342 are spaced apart from each other, cover both ends of the channel layer 330, and are disposed on the retention layer 322. Herein, the channel layer 330 may be made of indium gallium zinc oxide (IGZO), which is an amorphous structure, and the gate electrode 310 and the source and drain electrodes 341, 342 may be made of Cu, which is a conductive material, but are not limited to The gate insulating layer 321 includes ions, and these ions may be hydrogen ions.

To this end, the gate insulating layer 321 may be made of $Al_2O_3$ laminated by low-temperature atomic layer deposition (ALD). In this case, a weak ionic bond of AlO—H is formed by $H_2O$ used in the atomic layer deposition process. This ionic bond is separated into $AlO^-$ and $H^+$ by gate bias such that a large number of hydrogen ions are included in the gate insulating layer 321.

The hydrogen ions included in the gate insulating layer 321 move inside the gate insulation layer 321 and the retention layer 322 in accordance with the gate bias applied to the gate electrode 310, and by adjusting the number of the hydrogen ions moved to the side of the channel layer 330, it induces a gating effect and at the same time induces hysteresis.

The retention layer 322 is made of an insulating material having a greater hydrogen bonding force than the gate insulating layer 321. For example, the retention layer 322 may be made of $SiO_2$, $Si_3N_4$ or the like.

Herein, the Si—H bonding force inside the retention layer 322 is stronger than the Al—H bonding force (28 KJ/mol) inside the gate insulating layer 321.

Accordingly, the movement speed of hydrogen ions in the retention layer 322 is slower than in the gate insulating layer 321. That is, hydrogen ions inside the retention layer 322 move relatively slowly into the gate insulating layer 321 to improve retention characteristics.

Figure 21:
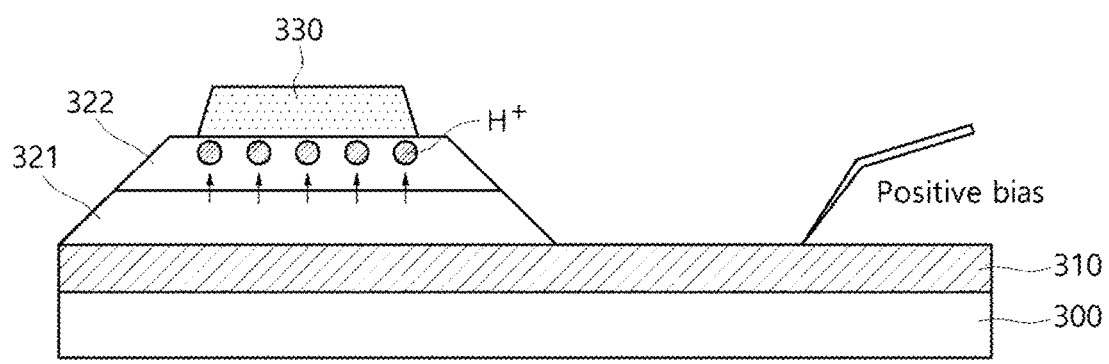
FIG. 21 is a diagram for describing the operation principle of a synaptic transistor according to the third exemplary embodiment of the present invention.
Figure 21:
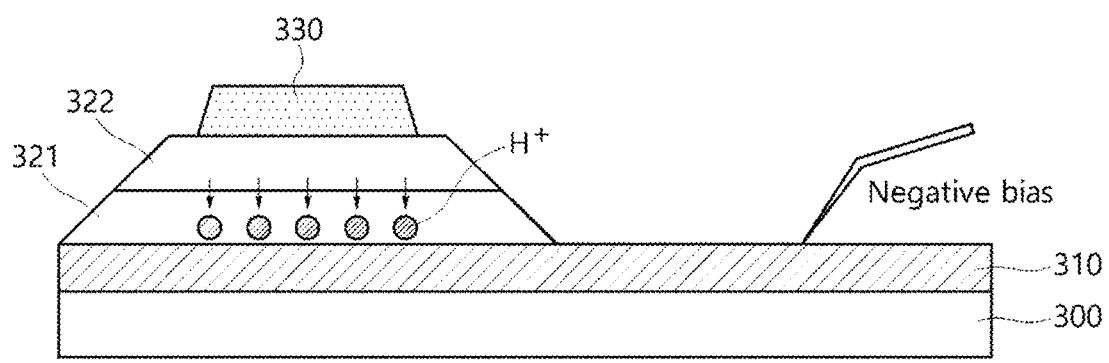

FIG. 21 is a diagram for describing the operation principle of a synaptic transistor according to the third exemplary embodiment of the present invention.

As illustrated in FIG. 21(a), when a positive bias is applied to the gate electrode 310, hydrogen ions ($H^+$) move from side of the gate electrode 310 to the side of the channel layer 330. That is, when a positive bias is applied to the gate electrode 310, the hydrogen ions ($H^+$) inside the gate insulating layer 321 move upward by the repulsive force thereof to be adjacent to the channel layer 330 via the retention layer 322.

As such, as the number of hydrogen ions ($H^+$) adjacent to the channel layer 330 increases, the threshold voltage decreases and the electrical conductivity increases.

Unlike the above, as illustrated in FIG. 21(b), when a negative bias is applied to the gate electrode 310, the hydrogen ions ($H^+$) inside the retention layer 322 move downward due to the attraction force thereof to be adjacent to the gate electrode 310 via the gate insulating layer 321.

As such, as the number of hydrogen ions ($H^+$) adjacent to the channel layer 330 decreases, the threshold voltage increases and the electrical conductivity decreases.

Meanwhile, since the Si—H bonding force in the retention layer 322 is stronger than the Al—H bonding force (28 KJ/mol) in the gate insulating layer 321, the movement speed of hydrogen ions in the retention layer 322 becomes slower than that in the gate insulation layer 322. That is, the hydrogen ions inside the retention layer 322 move relatively slowly into the gate insulating layer 321 to improve the retention characteristics.

As such, in the synaptic transistor according to the third exemplary embodiment of the present invention, by further disposing the retention layer 322 between the gate insulating layer 321 and the channel layer 322, it is possible to lower the threshold voltage and at the same time improve the retention characteristics for long-term memory.

Figure 22:
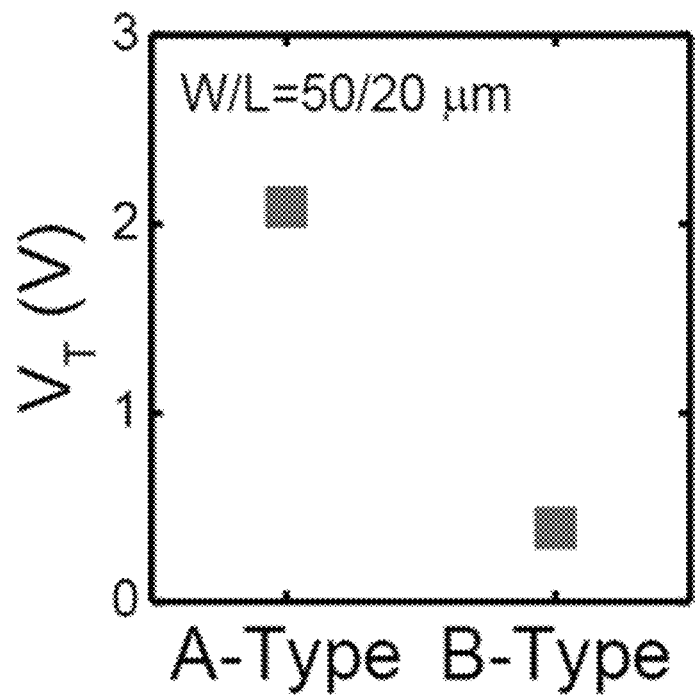
FIG. 22 is a graph showing the threshold voltages of a conventional synaptic transistor and the synaptic transistor according to the third exemplary embodiment of the present invention.
Figure 23:
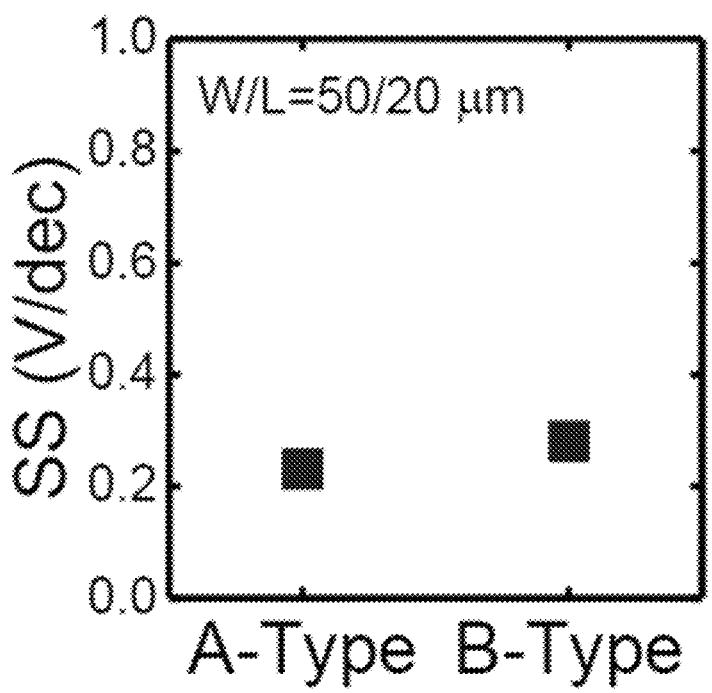
FIG. 23 is a graph showing the sub-threshold swings (SS) of a conventional synaptic transistor and the synaptic transistor according to the third exemplary embodiment of the present invention.
Figure 24:
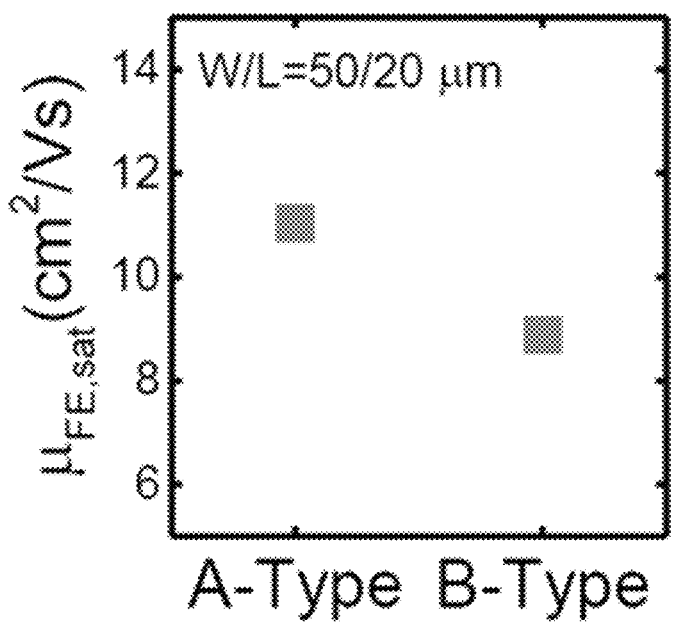
FIG. 24 is a graph illustrating the mobilities of a conventional synaptic transistor and the synaptic transistor according to the third exemplary embodiment of the present invention.
Figure 25:
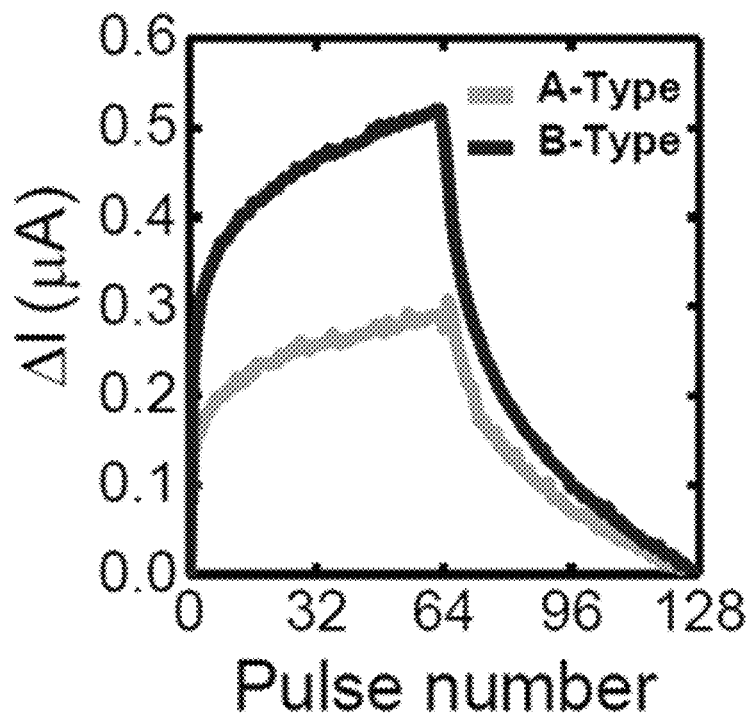
FIG. 25 is a graph illustrating the amount of change in current with respect to the number of pulses of a conventional synaptic transistor and the synaptic transistor according to the third exemplary embodiment of the present invention.
Figure 26:
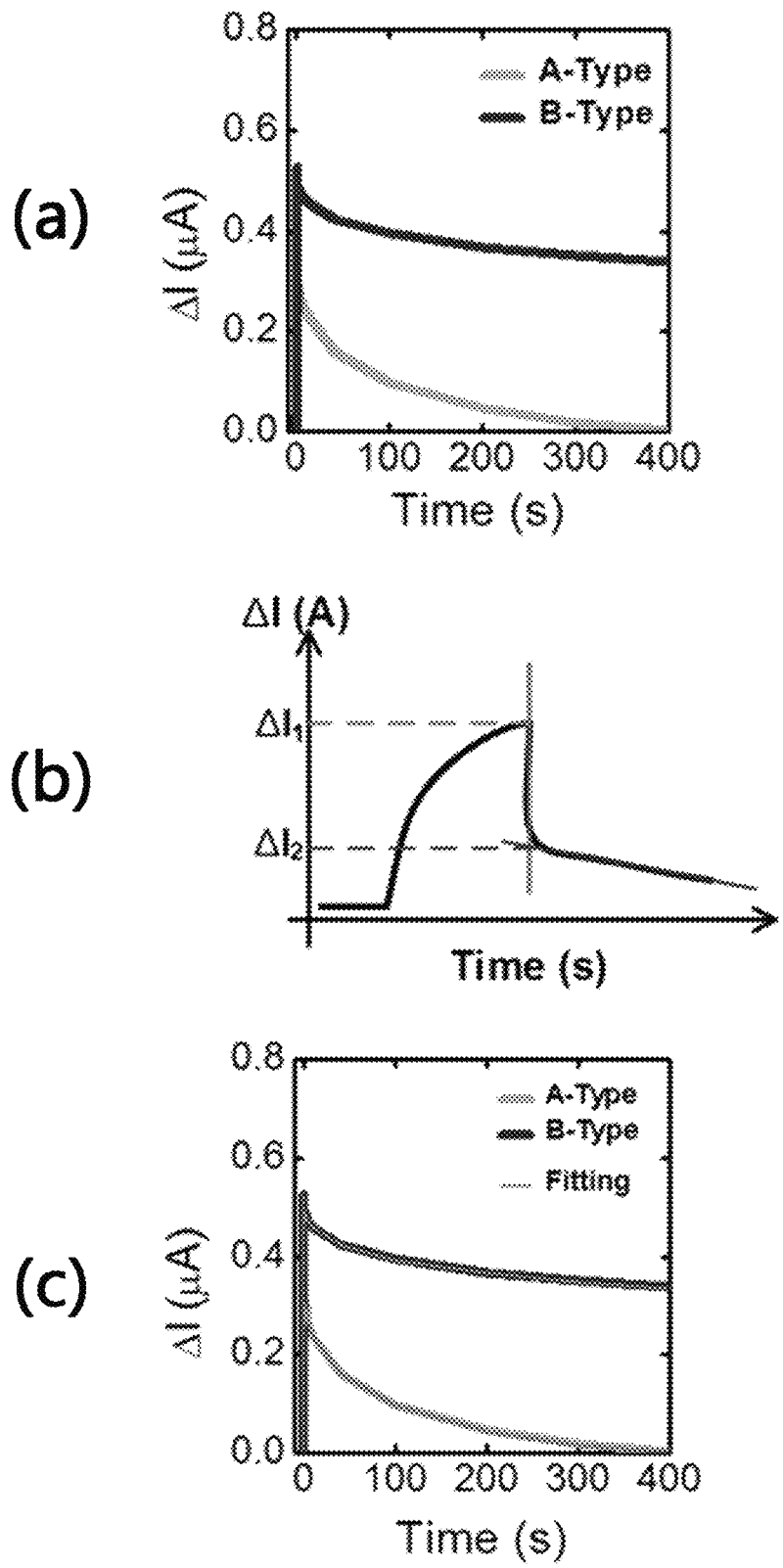
FIG. 26 is a graph illustrating the amount of change in current with respect to the time of a conventional synaptic transistor and the synaptic transistor according to the third exemplary embodiment of the invention.

FIG. 22 is a graph showing the threshold voltages of a conventional synaptic transistor and the synaptic transistor according to the third exemplary embodiment of the present invention, FIG. 23 is a graph showing the sub-threshold swings (SS) of a conventional synaptic transistor and the synaptic transistor according to the third exemplary embodiment of the present invention, and FIG. 24 is a graph illustrating the mobilities of a conventional synaptic transistor and the synaptic transistor according to the third exemplary embodiment of the present invention. In addition, FIG. 25 is a graph illustrating the amount of change in current with respect to the number of pulses of a conventional synaptic transistor and the synaptic transistor according to the third exemplary embodiment of the present invention, and FIG. 26 is a graph illustrating the amount of change in current with respect to the time of a conventional synaptic transistor and the synaptic transistor according to the third exemplary embodiment of the invention.

Herein, the conventional synaptic transistor is denoted by A-Type in which the retention layer 322 is not disposed between the gate insulating layer 321 and the channel layer 330, and the synaptic transistor according to the third exemplary embodiment of the present invention is denoted by B-Type. Then, the width W and the length L of the channel layer 330 were formed to be 50 μm and 20 μm, respectively, and the experiment was performed.

Referring to FIG. 22, it can be confirmed that the threshold voltage $V_T$ of A-Type is about 2.1 V, and the threshold voltage $V_T$ of B-Type is about 0.3 V. Thus, it can be experimentally confirmed that the synaptic transistor according to the third exemplary embodiment of the present invention has a low threshold voltage $V_T$ compared to the conventional one.

Referring to FIG. 23, it can be confirmed that the sub-threshold swing (SS) of A-Type is about 0.2 V/dec and the sub-threshold swing (SS) of B-type is about 0.3 V/dec. As described above, it can be experimentally confirmed that the sub-threshold swing (SS) of the synaptic transistor according to the third exemplary embodiment of the present invention has almost no difference from that of the conventional one.

Referring to FIG. 24, it can be confirmed that the mobility of A-Type ($\mu_{FE,sat}$) is about 11 $cm^2/Vs$, and the mobility of B-Type ($\mu_{FE,sat}$) is about 9 $cm^2/Vs$. Thus, it can be experimentally confirmed that the mobility of the synaptic transistor ($\mu_{FE,sat}$) according to the third exemplary embodiment of the present has almost no difference from that of the conventional one.

As such, the synaptic transistor according to the third exemplary embodiment of the present invention may lower the threshold voltage $V_T$ and improve the electric conductivity without affecting the sub-threshold swing (SS) and mobility ($\mu_{FE,sat}$) compared to the conventional one.

Referring to FIG. 25, the current change amount ΔI was measured by applying pulses in a range of 0 to 64 to the conventional synaptic transistor and the synaptic transistor according to the third exemplary embodiment of the present invention.

As a result of the measurement, it can be experimentally confirmed that the current change amount ΔI of the synaptic transistor according to the third exemplary embodiment of the present invention was increased in accordance with the pulse number compared to the conventional one.

As such, in the synaptic transistor according to the third exemplary embodiment of the present invention, an increase width of the drain current in accordance with the pulse number compared to the conventional one is increased, and the synaptic characteristics may be improved.

Referring to FIG. 26(a), the current change amount ΔI according to the time change after applying a pulse to the conventional synaptic transistor and the synaptic transistor according to the third exemplary embodiment of the present invention was measured.

As a result of the measurement, it can be experimentally confirmed that the A-Type does not maintain the current for 400 seconds after the application of the pulse and recovers all, whereas the B-Type maintains about 65% of the current for 400 seconds after the application of the pulse.

Referring to FIGS. 26(b) and 26(b), the graph of FIG. 26(a) was subjected to exponential fitting to calculate and compare tau values t of A-Type and B-Type.

Specifically, the graph of FIG. 26(a) may be defined by FIG. 26(b) and Mathematical Formula 1 below, and the first and second tau values $\tau_1$, $\tau_2$ may be calculated by Mathematical Expression 1.

$$\Delta I_1 \times \exp(-t/\tau_1) + \Delta I2 \times \exp(-t/\tau_2) \quad \text{<Mathematical Expression 1>}$$

As a result of the calculation, it can be confirmed that the first tau value ($\tau_{1,A\text{-}Type}$) of A-Type and the first tau value ($\tau_{1,B\text{-}Type}$), of B-Type are equal to 0.01, whereas the second tau value of A-Type ($\tau_{2,A\text{-}type}$) is $4 \times 10^3$, and the second tau value of B-Type ($\tau^{2,B\text{-}type}$) is $4 \times 10^4$, and thus, the retention characteristics of B-Type were improved by 10 times or more than that of A-Type.

In summary, the synaptic transistor according to the third exemplary embodiment of the present invention may improve the retention characteristics while lowering the threshold voltage without deterioration of the relatively large characteristics (e.g., mobility) compared to the conventional transistor.

FIGS. 27A to 27E are diagrams for describing the manufacturing method of a synaptic transistor according to the third exemplary embodiment of the present invention.

Figure 27A:
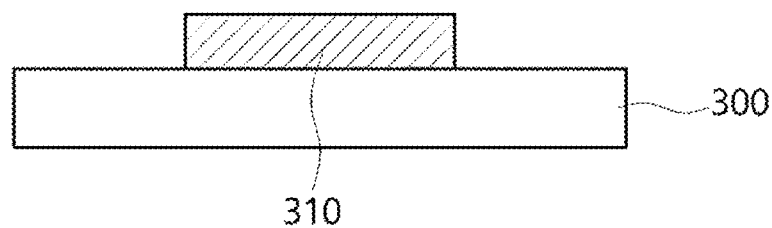
FIGS. 27A to 27E are diagrams for describing the manufacturing method of a synaptic transistor according to the third exemplary embodiment of the present invention.

First, referring to FIG. 27A, a gate electrode 310 is formed to extend in one direction on the substrate 300. For example, Cu may be melted using the electron beam vacuum evaporation (e-beam evaporator) to form a gate electrode 310 having a thickness of about 20 nm on the substrate 300.

Figure 27B:
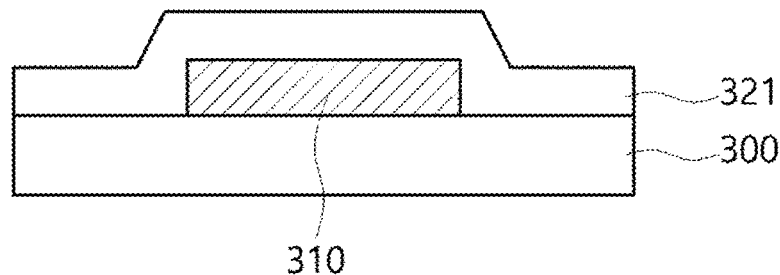

Next, referring to FIG. 27B, a gate insulating layer 321 is formed on the substrate 300 so as to cover the gate electrode 310. In this case, the gate insulating layer 321 may include hydrogen ions.

For example, low-temperature atomic layer deposition (ALD) may be used to deposit $Al_2O_3$ to a thickness of about 40 nm to form a gate insulating layer 321. In this case, a weak ionic bond of AlO—H is formed by $H_2O$ used in the atomic layer deposition process. This ionic bond is separated into $AlO^-$ and $H^+$ by gate bias such that a large number of hydrogen ions are included in the gate insulating layer 321.

Figure 27C:
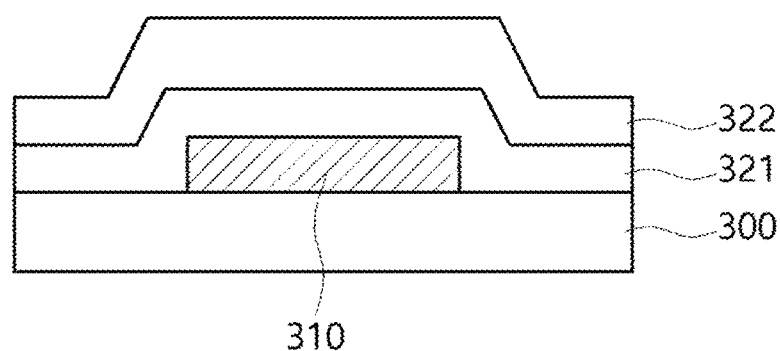

Next, referring to FIG. 27C, a retention layer 322 is formed on the gate insulating layer 321. In this case, the retention layer 322 may be formed of an insulating material having a stronger hydrogen bonding force than the gate insulating layer 321. For example, the retention layer 322 may be formed of $SiO_2$, $Si_3N_4$ or the like.

Figure 27D:
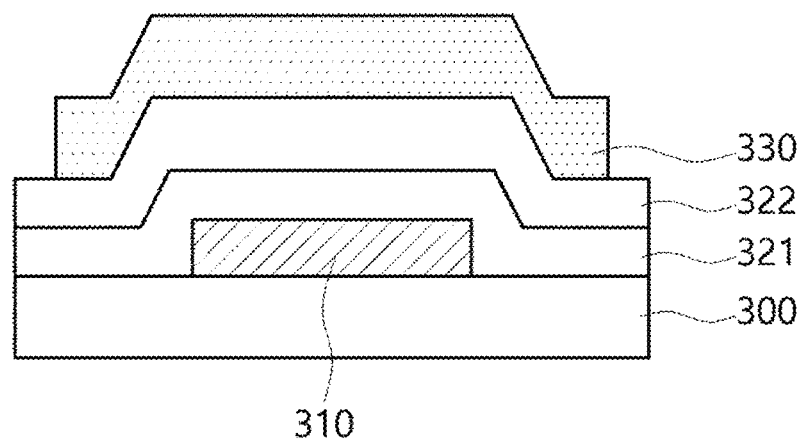

Next, referring to FIG. 27D, a channel layer 330 is formed on the retention layer 322 to correspond to one end of the gate electrode 310. For example, the channel layer 330 may be formed by depositing IGZO to a thickness of about 35 nm using the sputtering technique.

Figure 27E:
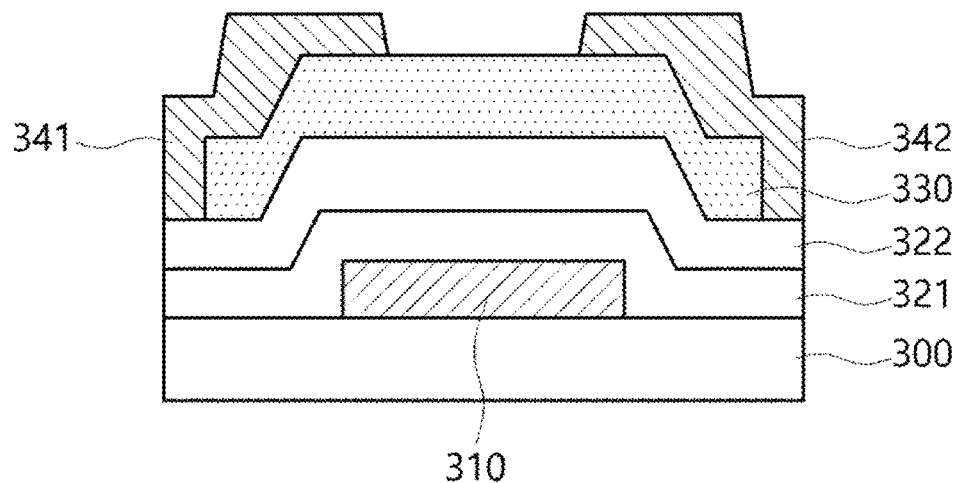

Next, referring to FIG. 27E, a source electrode 341 and a drain electrode 342 are formed on the retention layer 322 so as to be spaced apart from each other and cover both ends of the channel layer 330. For example, the source and drain electrodes 341 and 342 may be respectively formed to a thickness of about 30 nm on the retention layer 322 by melting Cu using the electron beam vacuum evaporation (e-beam evaporator).

The invention claimed is:

1. A synaptic transistor with long-term and short-term memory characteristics, comprising:
   a substrate;
   a bottom gate electrode disposed on the substrate;
   a first gate insulating layer comprising ions, covering the bottom gate electrode, and disposed on the substrate;
   a floating gate electrode disposed on the first gate insulating layer to correspond to the bottom gate electrode;
   a second gate insulating layer comprising ions, covering the floating gate electrode, and disposed on the first gate insulating layer;
   a channel layer disposed on the second gate insulating layer to correspond to the floating gate electrode; and
   source and drain electrodes spaced apart from each other, covering both ends of the channel layer, and disposed on the second gate insulating layer.

2. The synaptic transistor of claim 1, wherein in performing the operation of the short-term memory characteristic, the ions move from the side of the bottom gate electrode to the side of the channel layer, when a positive bias less than a reference voltage is applied to the bottom gate electrode.

3. The synaptic transistor of claim 1, wherein in performing the operation of the short-term memory characteristic, the ions move from the side of the channel layer to the side of the bottom gate electrode, when a negative bias less than a reference voltage is applied to the bottom gate electrode.

4. The synaptic transistor of claim 1, wherein in performing the operation of the long-term memory characteristic, electrons included in the bottom gate electrode move over the first gate insulating layer to the bottom gate electrode, when a positive bias greater than or equal to a reference voltage is applied to the bottom gate electrode.

5. The synaptic transistor of claim 1, wherein in performing the operation of the long-term memory characteristic, electrons included in the bottom gate electrode move over the first gate insulating layer to the floating gate electrode, when a negative bias greater than or equal to a reference voltage is applied to the bottom gate electrode.

6. The synaptic transistor of claim 1, wherein the first and second gate insulating layers are made of $Al_2O_3$ laminated by atomic layer deposition.

* * * * *